(12) United States Patent
Mahler et al.

(10) Patent No.: US 9,958,137 B2
(45) Date of Patent: *May 1, 2018

(54) LIGHT-EMITTING DEVICE CONTAINING ANISOTROPIC FLAT COLLOIDAL SEMICONDUCTOR NANOCRYSTALS AND METHODS OF MANUFACTURE THEREOF

(71) Applicant: NEXDOT, Paris (FR)

(72) Inventors: Benoit Mahler, Paris (FR); Thomas Pons, Antony (FR); Elsa Cassette, Paris (FR)

(73) Assignee: NEXDOT, Paris (FR)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/229,211

(22) Filed: Aug. 5, 2016

(65) Prior Publication Data

US 2016/0356456 A1    Dec. 8, 2016

Related U.S. Application Data

(63) Continuation of application No. 14/328,786, filed on Jul. 11, 2014, now Pat. No. 9,447,927, which is a
(Continued)

(30) Foreign Application Priority Data

Mar. 19, 2012   (FR) ..................................... 12 00815

(51) Int. Cl.
*H01L 33/00* (2010.01)
*F21V 9/16* (2006.01)
(Continued)

(52) U.S. Cl.
CPC ................ *F21V 9/16* (2013.01); *B82Y 20/00* (2013.01); *F21K 9/64* (2016.08); *H01L 33/06* (2013.01);
(Continued)

(58) Field of Classification Search
CPC ........ B82Y 20/00; B82Y 30/00; B05D 1/005; B05D 7/52; B22F 1/02; B22F 1/0018;
(Continued)

(56) References Cited

U.S. PATENT DOCUMENTS

| 4,634,229 A | 1/1987 | Amstutz |
| 5,422,489 A | 6/1995 | Bhargava |

(Continued)

FOREIGN PATENT DOCUMENTS

| JP | 2005-515273 A | 5/2005 |
| JP | 2005-522005 A | 7/2005 |

(Continued)

OTHER PUBLICATIONS

International Search Report dated Jun. 26, 2013, corresponding to PCT/FR2013/050579.
(Continued)

*Primary Examiner* — A. Sefer
(74) *Attorney, Agent, or Firm* — Young & Thompson

(57) ABSTRACT

A device that emits light in response to an electrical or optical excitation, such as LEDs, displays, e-readers, device includes at least one anisotropic flat colloidal semiconductor nanocrystal whose smallest dimension, namely the thickness, is smaller than the other two by a factor of at least 1.5, the emitted light having an intensity and a polarization that vary according to the angle formed by the light emitting direction and the normal to the largest surface of the flat nanocrystal. The device allows to realize a light-emitting device exhibiting simultaneously a high emission spectral finesse and allows proper control of the wavelength, the directivity and/or polarization of the emitted light, and thus increases the brightness and color gamut of displays composed of such a device. Such devices are found for example in displays, televisions, mobile phones, tablets, or comput- (Continued)

ers. The various embodiments of these devices are also presented.

19 Claims, 15 Drawing Sheets

Related U.S. Application Data continuation-in-part of application No. PCT/FR2013/050579, filed on Mar. 19, 2013.

(51) Int. Cl.
| | | |
|---|---|---|
| *H01L 33/06* | (2010.01) | |
| *B82Y 20/00* | (2011.01) | |
| *F21K 9/64* | (2016.01) | |
| *H01L 33/32* | (2010.01) | |
| *B82Y 30/00* | (2011.01) | |
| *H01L 33/08* | (2010.01) | |
| *H01L 33/50* | (2010.01) | |
| *F21Y 115/10* | (2016.01) | |

(52) U.S. Cl.
CPC ............ *H01L 33/32* (2013.01); *H01L 33/502* (2013.01); *B82Y 30/00* (2013.01); *F21Y 2115/10* (2016.08); *H01L 33/08* (2013.01); *H01L 33/505* (2013.01); *H01L 33/507* (2013.01); *Y10S 977/95* (2013.01)

(58) Field of Classification Search
CPC ............ H01L 51/5048; H01L 51/5012; Y10T 428/24893; Y10T 428/24909; Y10T 428/256; Y10T 428/258; Y10T 428/25
See application file for complete search history.

(56) References Cited

U.S. PATENT DOCUMENTS

| | | | |
|---|---|---|---|
| 5,705,285 A | | 1/1998 | Shi et al. |
| 5,922,453 A | * | 7/1999 | Horn, III .................. C08K 3/22 |
| | | | 428/323 |
| 6,501,091 B1 | | 12/2002 | Bawendi et al. |
| 6,528,145 B1 | * | 3/2003 | Berger ................ H01L 21/4857 |
| | | | 174/256 |
| 7,332,211 B1 | | 2/2008 | Bulovic et al. |
| 7,699,215 B2 | | 4/2010 | Spivey, Sr. |
| 2004/0095658 A1 | | 5/2004 | Buretea et al. |
| 2005/0236556 A1 | | 10/2005 | Sargent et al. |
| 2005/0253152 A1 | | 11/2005 | Klimov et al. |
| 2010/0053928 A1 | | 3/2010 | Belcher et al. |
| 2010/0148156 A1 | | 6/2010 | Jang et al. |
| 2010/0265307 A1 | | 10/2010 | Linton et al. |
| 2010/0276731 A1 | | 11/2010 | Nam et al. |
| 2011/0080090 A1 | * | 4/2011 | Wood .................... C09K 11/565 |
| | | | 313/506 |
| 2014/0110859 A1 | * | 4/2014 | Rafferty .............. H01L 23/4985 |
| | | | 257/774 |

FOREIGN PATENT DOCUMENTS

| | | |
|---|---|---|
| JP | 2010-532910 A | 10/2010 |
| JP | 2011-080067 A | 4/2011 |
| KR | 20100117749 | 11/2010 |
| KR | 20120027815 | 3/2012 |
| WO | 0017903 | 3/2000 |
| WO | 2009011922 | 1/2009 |
| WO | 2010028728 | 3/2010 |
| WO | 2010124212 | 10/2010 |

OTHER PUBLICATIONS

S. Ithurria et al., "Continuous Transition from 3D to 1D Confinement Observed during the Formation of CdSe Nanoplatelets", J. Am. Chem. Soc. 2011, 133, pp. 3070-3077.
S. Ithurria et al., "Quasi 2D Colloidal CdSe Platelets with Thicknesses Controlled at the Atomic Level", J. Am. Chem. Soc. 2008, vol. 130, No. 49, pp. 16504-16505.
Kim et al., "Full-colour quantum dot displays fabricated by transfer printing", Nature Photonics 2011, 5, pp. 176-182.
Abecassis et al., "Self-assembly of CdSe nanoplatelets into giant micrometer-scale needles emitting polarized ight", Nano Letters 2014, 14, pp. 710-715.
Cassette et al., "Colloidal CdSe/CdS dot-in-plate nanocrystals with 2D-polarized emission", ACS nano 2012, 6, pp. 6741-6750.

* cited by examiner

LIGHT-EMITTING DEVICE CONTAINING ANISOTROPIC FLAT COLLOIDAL SEMICONDUCTOR NANOCRYSTALS AND METHODS OF MANUFACTURE THEREOF

TECHNICAL FIELD

This invention relates to devices that emit light in response to an electrical or luminous excitation, such as light emitting diodes, displays, e-readers, etc. Such devices are found for example in displays, televisions, cell phones, tablets or computers. The devices of the type in question still have, despite steady progress, a certain number of limitations both in regard to color rendering and the contrast, brightness, energy efficiency, and the visual impression depending on the angle of observation.

BACKGROUND

To restore the colors in all their variety, one proceeds in general by additive synthesis of at least three complementary colors, especially red, green and blue. In a chromaticity diagram, the subset of available colors obtained by mixing different proportions of these three colors is formed by the triangle formed by the three coordinates associated with the three colors red green and blue. This subset constitutes what is called a gamut.

The majority of color display devices operates on this three-color principle: each pixel consists of three sub-pixels, one red, one green and one blue, whose mixture with different intensities can reproduce a colorful impression.

A luminescent or backlit display such as a computer LCD screen has to present the widest possible gamut for an accurate color reproduction. For this, the composing sub-pixels must be of the most saturated colors possible in order to describe the widest possible gamut. A light source has a saturated color if it is close to a monochromatic color. From a spectral point of view, this means that the light emitted by the source is comprised of a single narrow band of wavelengths. We recall that a highly saturated shade has a vivid, intense color while a less saturated shade appears more bland and gray.

It is therefore important to have light sources whose emission spectra are narrow and therefore of saturated colors.

For example, in the case of a color display, the red, green and blue sub-pixels composing it must have a spectrum maximizing the gamut of the display system, which amounts to exhibiting the narrowest possible emission from a spectral point of view.

It is possible to distinguish two types of polychromic light-emitting displays:
  Backlit displays, in which a white light coming from the backlighting is filtered by color filters and whose intensity is controlled by a liquid crystal system: these are the liquid-crystal displays (LCD),
  Directly emissive displays, in which each pixel consists of at least three sub-pixels corresponding to three basic colors. Each sub-pixel is a light emitter independently addressed, often through a matrix or multiplexed system, which emitted light intensity is then directly set. This is the case of plasma screens and light-emitting diodes screens such as OLEDs screens (for "Organic Light Emitting Diode"). These devices use a material emitting light in response to an excitation.

In LCD screens, the color of the pixels is determined by the filtering of a white primary source by red, green and blue filters. The spectra of the three sub-pixels therefore correspond to the multiplication of the emission spectrum of the primary source, which is usually an array of white LEDs or a cold cathode fluorescent tube, by the transmission spectrum of the filters used. The fact of optimizing the spectra of the primary light source or of the color filters therefore allows improving the gamut. However, most of the light emitted by the white primary source is either reabsorbed by the polarizers and color filters that make up the screen, or deflected by diffusion and waveguide effect in the different layers. Thus it does not reach the observer, which severely limits the energy efficiency of liquid-crystal displays. It therefore requires, to limit power consumption, to seek a gamut-brightness compromise.

To increase the color gamut and brightness of the screen without significant change of the filters and the primary light source, it has been recently proposed to add a fluorescent film containing colloidal quantum dots between the light source and the pixels in order to modify the spectrum of the light coming from the source after passing through the film in question and thus to enhance the saturation of the three sub-pixels[4, 5]. However, this solution, even though improving the gamut, decreases the brightness of the screen.

It was also proposed to replace the filters by green, red and blue wavelength converters which absorb the primary light, blue or ultraviolet for instance, and which retransmit the specific color of each converter. For this, a material containing fluorophores which absorb the light from a primary excitation source and re-emit it at a higher wavelength is used. However, this solution has issues of stability, fluorescence efficiency, and spectral finesse of the fluorophores used in said wavelength converters.

The directly emissive displays, such as displays composed of light-emitting diodes, are potentially lower in energy consumption; there is little or no loss by filtering. However, when using semi-conductor layers, such as in inorganic diodes or polymer layers as in the case of OLEDs, light losses by total internal reflections in said layers, reduce the total light that reaches the observer.

In directly emissive displays, the nature of the excitation can be various:
  Electric, by charges injection as in the case of organic or inorganic light-emitting diodes.
  Optical, by absorption of photons of wavelength shorter than the emission wavelength, as in the case of wavelength converters or plasma screens.

Many emissive materials have been proposed to try to cover the entire visible spectrum.

Thus, organic fluorophores, present for example in OLEDs have a high quantum yield in the visible, commonly greater than 90%. They are generally poorly stable, degrading for example due to oxidation or radiations, which reduces the lifetime of the containing devices. Moreover the width of the fluorescence spectra can be quite large, which does not allow to obtain a large gamut. Finally, the optimal excitation wavelength can be different for each fluorophore, making their integration into a system with a common excitation source difficult.

Oxides or complexes of the rare earths are emissive materials commonly used, such as in plasma screens and OLEDs. In this case, the emissive material is much more stable as it is weakly sensitive to oxidation. The width of the emission peaks can be very small, of the order of ten nanometers, but the absorption cross section of these materials is low, which may require the use of large quantities. Moreover their emission wavelength is not tunable, because it is defined by the material, for example the rare earth complex used. This is an important limitation, which does not allow this type of transmitters to cover the entire visible spectrum.

The emissive materials of plasma screens or OLEDs sometimes include a transition metal oxide. As for the rare earth oxides, the fluorescent material is very stable as it is weakly sensitive to oxidation. However, the fluorescence spectral width is very high, typically from fifty to several hundred nanometers, which does not allow to generate saturated colors and thus to present a high gamut.

Semiconductor nanoparticles, commonly called "quantum dots", are an alternative as emissive material. Said objects have a narrow fluorescence spectrum, approximately 30 nm full width at half maximum, and offer the possibility to emit in the entire visible spectrum as well as in the infrared with a single excitation source in the ultraviolet[8, 9]. However, they do not allow to optimize the light received by the observer and thus the energetic efficiency of the device. In this case an improvement of the gamut of polychromic displays requires a finesse of the emission spectra that is not accessible for quantum dots.

The object of the present invention is thus to provide a new light-emitting device allowing a great spectral emission finesse, a perfect control of the emission wavelength, the directivity and/or polarization of the emitted light. The present invention thus significantly improves the brightness and color gamut of displays composed of said devices.

SUMMARY OF THE INVENTION

The present invention relates to a component, for emitting light in response to the activation of excitation means, comprising a support and at least one anisotropic flat semiconductor colloidal nanocrystal whose smallest dimension, namely the thickness, is smaller than the other two dimensions by a factor of at least 1.5, the normal to the largest surface of the at least one anisotropic flat semiconductor colloidal nanocrystal being substantially parallel or substantially perpendicular to the support; said emitted light having an intensity and a polarization that vary according to the angle formed by the light emitting direction and the normal to the largest surface of the flat nanocrystal.

In one embodiment, the at least one anisotropic flat semiconductor colloidal nanocrystal is a colloidal semiconductor nanosheet.

In one embodiment, the at least one anisotropic flat colloidal semiconductor nanocrystal comprises at least one of the compounds of group IV, group III-V, group II-VI, Group III-VI, Group I-III-VI, group II-V or group IV-VI, or mixture thereof.

In one embodiment, the at least one anisotropic flat colloidal semiconductor nanocrystal comprises at least one of the following compounds: Si, Ge, CdS, CdSe, CdTe, ZnS, ZnSe, ZnTe, HgS, HgSe, HgTe, PbS, PbSe, PbTe, $CuInS_2$, $CuInSe_2$, $AgInS_2$, $AgInSe_2$, CuS, $Cu_2S$, $Ag_2S$, $Ag_2Se$, $Ag_2Te$, InN, InP, InAs, InSb, $In_2S_3$, $Cd_3P_2$, $Zn_3P_2$, $Cd_3As_2$, $Zn_3As_2$, ZnO, AlN, AlP, AlAs, AlSb, GaN, GaP, GaAs, GaSb $FeS_2$, $TiO_2$, $Bi_2S_3$, $Bi_2Se_3$, $Bi_2Te_3$.

In one embodiment, the at least one anisotropic flat colloidal semiconductor nanocrystal is a heterostructure comprising an anisotropic flat colloidal semiconductor nanocrystal In one embodiment, the at least one anisotropic flat colloidal semiconductor nanocrystal is totally covered by a semiconductor of different chemical composition.

In one embodiment, the at least one anisotropic flat colloidal semiconductor nanocrystal has a narrow fluorescence spectrum, with a full width at half maximum of less than 30 nm, or 25 nm, or 23 nm, or preferably 20 nm.

In one embodiment, the support is transparent to the emitted light in at least one direction to an observer situated outside the component, the support surface through which the light is emitted towards the observer being defined as emitting face.

In one embodiment, the support comprises a liquid having the properties of liquid crystals.

In one embodiment, the support is flexible or rigid.

In one embodiment, the support comprises an inorganic material or an organic material.

In one embodiment, the support comprises a polymer material.

In one embodiment, the component comprises at least two anisotropic flat colloidal semiconductor nanocrystals having different characteristics, dimensions and/or chemical compositions and/or emission wavelengths.

In one embodiment, substantially all of the flat nanocrystals of the component have the normal to their surfaces substantially parallel to a given direction.

The present invention also relates to a light emitting system with at least one excitation means comprising means for applying to the anisotropic flat colloidal semiconductor nanocrystal an electromagnetic field, including a light source, where at least part of the emitted light is absorbed by the anisotropic flat colloidal semiconductor nanocrystal, such as a gallium nitride diode.

The present invention also relates to an apparatus comprising at least one component and/or at least one system according to the present invention.

The present invention also relates to a component to emit light in response to the activation of excitation means, comprising a support and a plurality of anisotropic flat colloidal semiconductor nanocrystals whose smallest dimension, namely the thickness, is smaller than the other two dimensions by a factor of at least 1.5, wherein at least 50% of the plurality of nanocrystals have their normal to their largest surface substantially parallel to a given direction.

In one embodiment, the plurality of anisotropic flat colloidal semiconductor nanocrystals have their normal to the largest surface substantially parallel or substantially perpendicular to the support.

In one embodiment, the plurality of anisotropic flat colloidal semiconductor nanocrystals is a plurality of anisotropic flat colloidal semiconductor nanosheets.

In one embodiment, the plurality of anisotropic flat colloidal semiconductor nanocrystals comprises at least one compound of group IV, group III-V, group II-VI, group III-VI, group I-III-VI, group II-V or group IV-VI, or mixture thereof.

In one embodiment, the plurality of anisotropic flat colloidal semiconductor nanocrystals comprises at least one of the following compounds: Si, Ge, CdS, CdSe, CdTe, ZnS, ZnSe, ZnTe, HgS, HgSe, HgTe, PbS, PbSe, PbTe, $CuInS_2$, $CuInSe_2$, $AgInS_2$, $AgInSe_2$, CuS, $Cu_2S$, $Ag_2S$, $Ag_2Se$, $Ag_2Te$, InN, InP, InAs, InSb, $In_2S_3$, $Cd_3P_2$, $Zn_3P_2$, $Cd_3As_2$, $Zn_3As_2$, ZnO, AlN, AlP, AlAs, AlSb, GaN, GaP, GaAs, GaSb $FeS_2$, $TiO_2$, $Bi_2S_3$, $Bi_2Se_3$, $Bi_2Te_3$.

In one embodiment, the plurality of anisotropic flat colloidal semiconductor nanocrystals comprises at least one heterostructure comprising an anisotropic flat colloidal semiconductor nanocrystal.

In one embodiment, the plurality of anisotropic flat colloidal semiconductor nanocrystals comprises at least one anisotropic flat colloidal semiconductor nanocrystal totally covered with a semiconductor of different chemical composition.

In one embodiment, the plurality of anisotropic flat colloidal semiconductor nanocrystals exhibits a narrow fluorescence spectrum, with a full width at half maximum less than 100 nm, 75 nm, 50 nm, 40 nm, 30 nm, 25 nm, 24 nm, 23 nm, 22 nm, 21 nm or 20 nm.

In one embodiment, the support is transparent for the emitted light in at least one direction towards an observer located outside the component, the support surface through which the light is emitted towards the observer being defined as emitting face.

In one embodiment, the support comprises a liquid having liquid crystals properties.

In one embodiment, the support is flexible or rigid.

In one embodiment, the support comprises an inorganic material or an organic material.

In one embodiment, the support comprises a polymer material.

In one embodiment, the plurality of anisotropic flat colloidal semiconductor nanocrystals comprises at least two anisotropic flat colloidal semiconductor nanocrystals having different characteristics, dimensions and/or chemical compositions and/or emission wavelengths.

In one embodiment, the emitted light has an intensity and a polarization which vary according to the angle formed by the light emitting direction and the normal to the largest surface of the plurality of anisotropic flat colloidal semiconductor nanocrystals.

The present invention also relates to a light emitting system comprising a component according to the present invention and at least one excitation means comprising means for applying to the plurality of anisotropic flat colloidal semiconductor nanocrystals an electromagnetic field, in particular a light source, wherein at least a portion of the emitted light is absorbed by the plurality of anisotropic flat colloidal semiconductor nanocrystals; such as a gallium nitride diode.

The present invention also relates to an apparatus comprising a component or a system according to the present invention.

DETAILED DESCRIPTION OF THE INVENTION

The present invention relates to a device that emits light in response to the activation of excitation means, said device comprising at least one anisotropic flat colloidal semiconductor nanocrystal whose smallest dimension, namely the thickness, is smaller than the other two by a factor of at least 1.5, said emitted light having a polarization and an intensity that vary according to the angle formed by the light emitting direction and the normal to the largest surface of the flat nanocrystal.

In a preferred embodiment, the light emitting device comprises at least one assembly (i.e. a plurality) of anisotropic flat colloidal semiconductor nanocrystals.

In the following description, nanocrystal refers, except otherwise specified, to an anisotropic flat colloidal semiconductor nanocrystal, preferably a nanosheet. In the following description, the normal to the nanocrystal is defined as the normal to the largest surface of the anisotropic flat colloidal semiconductor nanocrystal. Within the present description, nanoplatelet, nanosheet, and nanoplate have the same meaning The present invention also relates to an excitation device comprising the excitation means for said light-emitting device. The excitation means comprising means of injection of electric charges, electrons and/or holes in the anisotropic flat colloidal semiconductor nanocrystal or means of applying to the anisotropic flat colloidal semiconductor nanocrystal an electromagnetic field.

An anisotropic flat colloidal semiconductor nanocrystal, according to the invention, is a crystalline particle which at least one of the dimensions, preferably the thickness, is smaller than the other two by a factor of at least 1.5.

In one embodiment of the invention, the crystalline particle as described above is a nanosheet or a heterostructure containing a quantum dot or a nanosheet.

In one embodiment of the invention, a heterostructure is a core/shell type structure in which the shell totally or partially covers the core.

In one embodiment, the heterostructure, as described above, comprises a core composed of a material and a shell composed of a material different from the material of the core.

In one embodiment of the invention, the shell can be composed of several identical or different materials.

In one embodiment, the heterostructure as described above comprises a core comprising a quantum dot or a nanosheet and a shell, said heterostructure having at least one of its dimensions, preferably the thickness, smaller than the other two by a factor of at least 1.5.

In one embodiment, the excitation means comprise means of injecting electrical charges, electrons and/or holes in the anisotropic flat colloidal semiconductor nanocrystal.

In one embodiment, the excitation means comprise means of applying to the anisotropic flat colloidal semiconductor nanocrystal an electromagnetic field.

In one embodiment, the electromagnetic field source is a light source which at least part of the emitted light is absorbed by the anisotropic flat colloidal semiconductor nanocrystal.

In one embodiment, the light source which at least part of the emitted light is absorbed by the anisotropic flat colloidal semiconductor nanocrystal is a gallium nitride (GaN) based diode.

In one embodiment, the excitation means comprise at least one electric or magnetic dipole coupled by electromagnetic interactions to the anisotropic flat colloidal semiconductor nanocrystal.

In one embodiment, for a single anisotropic flat colloidal semiconductor nanocrystal the ratio of intensity of the electromagnetic field between the normal to the largest surface of the nanocrystal and along the plane of largest surface of the nanocrystal is higher than 0.50, 0.55, 0.60; 0.65, 0.70, 0.75, 0.80, 0.85, 0.90 or 0.95.

In each of said direction, light exhibits polarization. In one embodiment, said polarization is linear, circular or a combination thereof.

In one embodiment, the polarization along the normal of the anisotropic flat colloidal semiconductor nanocrystal is circular. In one embodiment, the polarization along the surface of the anisotropic flat semiconductor colloidal nanocrystal is linear.

In one embodiment, an assembly of anisotropic flat semiconductor colloidal nanocrystals having separately a contrast of polarization exhibits a macroscopic polarization of its emission.

In one embodiment, the macroscopic emission polarization of the assembly of anisotropic flat semiconductor colloidal nanocrystals results from the global alignment of the nanocrystals. The contrast of polarization is highly related to the ratio of nanocrystals presenting the same orientation.

In one embodiment, the polarization contrast of the oriented assembly of anisotropic flat semiconductor colloidal nanocrystals is higher than 20%, 25%, 30%, 35%, 40%, 45%, 50%, 55%, 60%, 65%, 70%, 75%, 80%, 85%, 90%, or 95%.

The contrast of polarization C is defined as follow:

$$C = \frac{I_\perp - I_\parallel}{I_\perp + I_\parallel}$$

where I is the intensity of light in a given direction or polarization.

In one embodiment, more than 50% of the anisotropic flat colloidal semiconductor nanocrystals of the assembly have the same orientation, meaning having the same normal direction to the plane of the sheet within +/−40°, +/−30°, +/−20°, +/−10° or +/−5°.

In one embodiment, more than 55% of the anisotropic flat colloidal semiconductor nanocrystals of the assembly have the same orientation, meaning having the same normal direction to the plane of the sheet within +/−40°, +/−30°, +/−20°, +/−10° or +/−5°.

In one embodiment, more than 60% of the anisotropic flat colloidal semiconductor nanocrystals of the assembly have the same orientation, meaning having the same normal direction to the plane of the sheet within +/−40°, +/−30°, +/−20°, +/−10° or +/−5°.

In one embodiment, more than 65% of the anisotropic flat colloidal semiconductor nanocrystals of the assembly have the same orientation, meaning having the same normal direction to the plane of the sheet within +/−40°, +/−30°, +/−20°, +/−10° or +/−5°.

In one embodiment, more than 70% of the anisotropic flat colloidal semiconductor nanocrystals of the assembly have the same orientation, meaning having the same normal direction to the plane of the sheet within +/−40°, +/−30°, +/−20°, +/−10° or +/−5°.

In one embodiment, more than 75% of the anisotropic flat colloidal semiconductor nanocrystals of the assembly have the same orientation, meaning having the same normal direction to the plane of the sheet within +/−40°, +/−30°, +/−20°, +/−10° or +/−5°.

In one embodiment, more than 80% of the anisotropic flat colloidal semiconductor nanocrystals of the assembly have the same orientation, meaning having the same normal direction to the plane of the sheet within +/−40°, +/−30°, +/−20°, +/−10° or +/−5°.

In one embodiment, more than 85% of the anisotropic flat colloidal semiconductor nanocrystals of the assembly have the same orientation, meaning having the same normal direction to the plane of the sheet within +/−40°, +/−30°, +/−20°, +/−10° or +/−5°.

In one embodiment, more than 90% of the anisotropic flat colloidal semiconductor nanocrystals of the assembly have the same orientation, meaning having the same normal direction to the plane of the sheet within +/−40°, +/−30°, +/−20°, +/−10° or +/−5°.

In one embodiment, more than 95% of the anisotropic flat colloidal semiconductor nanocrystals of the assembly have the same orientation, meaning having the same normal direction to the plane of the sheet within +/−40°, +/−30°, +/−20°, +/−10° or +/−5°.

In a preferred embodiment, said orientation is defined as substantially parallel or substantially perpendicular to the normal of the emitting face of the component.

In one embodiment, the nanosheet, or the initial nanosheet or nanocrystal present in the heterostructure has at least one of its dimensions, preferably the thickness, of 0.3 nm to less than 0.3 nm to less than 500 nm, 0.3 nm to less than 250 nm, 0.3 nm to less than 100 nm, 0.3 nm to less than 50 nm, 0.3 nm to less than 25 nm, 0.3 nm to less than 20 nm, 0.3 nm to less than 15 nm, 0.3 nm to less than 10 nm, 0.3 nm to less than 5 nm.

In one embodiment, the nanosheet, or the initial nanosheet or nanocrystal present in the heterostructure has at least one lateral dimension of 0.3 nm to at least 1 mm, 0.3 nm to 100 μm, 0.3 nm to 10 μm, 0.3 nm to 1 μm, 0.3 nm to 500 nm, 0.3 nm to 250 nm, 0.3 nm to 100 nm, 0.3 nm to 50 nm, 0.3 nm to 25 nm.

In one embodiment, at least one of the lateral dimensions (length or width), preferably both lateral dimensions, of the anisotropic flat colloidal semiconductor nanocrystal represent(s) at least 1.5 times its thickness, at least 2 times its thickness, at least 2.5 times its thickness, at least 3 times its thickness, at least 3.5 times its thickness, at least 4 times its thickness, at least 4.5 times its thickness, at least 5 times its thickness.

In one embodiment, the thickness of the anisotropic flat colloidal semiconductor nanocrystal is 0.5 nm to less than 1 μm, 0.5 nm to less than 500 nm, 0.5 nm to less than 250 nm, 0.5 nm to less than 100 nm, 0.5 nm to less than 50 nm, 0.5 nm to less than 25 nm, 0.5 nm to less than 20 nm, 0.5 nm to less than 15 nm, 0.5 nm to less than 10 nm, 0.5 nm to less than 5 nm.

In one embodiment, the lateral dimensions of the anisotropic flat colloidal semiconductor nanocrystal are at least 0.75 nm to at least 1.5 mm.

In one embodiment, at least one of the lateral dimensions of the anisotropic flat colloidal semiconductor nanocrystal is 2 nm to 1.5 mm, 2 nm to 1 mm, 2 nm to 100 μm, 2 nm to 10 μm, 2 nm to 1 μm, 2 nm to 100 nm, 2 nm to 10 nm.

In one embodiment, the nanosheet, or the initial nanosheet or nanocrystal present in the heterostructure comprises semiconductors of group IV, III-V, II-VI, II-V, III-VI or/and group IV, group IIIA-VA, group IIA-VIA, group IIIA-VIA, group IA-IIIA-VIA, group IIA-VA, group IVA-VIA, group VIB-VIA, group VB-VIA, or group IVB-VIA.

In one embodiment, the nanosheet, or the initial nanosheet or nanocrystal present in the heterostructure, comprises a material of the composition $M_xE_y$ where:
  M is Zn, Cd, Hg, Cu, Ag, Al, Ga, In, Si, Ge, Pb, Sb, Sn, Pd, Fe, Au, Ti, Bi, W, Mo, V or a mixture thereof,
  E is O, S, Se, Te, N, P, As or a mixture thereof, and
  x and y are independently a decimal number of 0 to 5, and not simultaneously zero.

In one embodiment, the nanosheet, or the initial nanosheet or nanocrystal present in the heterostructure, comprises a material of the composition $M_xN_yE_z$, wherein:
  M is selected from Zn, Cd, Hg, Cu, Ag, Al, Ga, In, Si, Sn, Ge, Pb, Sb, Sn, Pd, Fe, Au, Ti, Bi, W, Mo, V or a mixture thereof;
  N is selected from Zn, Cd, Hg, Cu, Ag, Al, Ga, In, Si, Sn, Ge, Pb, Sb, Sn, Pd, Fe, Au, Ti, Bi, W, Mo, V or a mixture thereof;
  E is selected from O, S, Se, Te, N, P, As or a mixture thereof; and x, y and z are independently a decimal number from 0 to 5, at the condition that when x is 0, y and z are not 0, when y is 0, x and z are not 0 and when z is 0, x and y are not 0.

According to one embodiment, he nanosheet, or the initial nanosheet or nanocrystal present in the heterostructure is made of a quaternary compound such as InAlGaAs, ZnAgInSe or GaInAsSb.

In one embodiment, the nanosheet, or the initial nanosheet or nanocrystal present in the heterostructure comprises at least one of the following: Si, Ge, Sn, CdS, CdSe, CdTe, ZnS, ZnSe, ZnTe, HgS, HgSe, HgTe, PbS, PbSe, PbTe, $CuInS_2$, $CuInSe_2$, $AgInS_2$, $AgInSe_2$, CuS, $Cu_2S$, $Ag_2S$, $Ag_2Se$, $Ag_2Te$, InN, InP, InAs, InSb, $In_2S_3$, $Cd_3P_2$, $Zn_3P_2$, $Cd_3As_2$, $Zn_3As_2$, ZnO, AlN, AlP, AlAs, AlSb, GaN, GaP, GaAs, GaSb, $FeS_2$, $TiO_2$, $Bi_2S_3$, $Bi_2Se_3$, $Bi_2Te_3$, $MoS_2$, $WS_2$, $VO_2$, and alloys and mixtures thereof.

In one embodiment, the anisotropic flat colloidal semiconductor nanocrystal comprises semiconductors of group IV, III-V, II-VI, I-III-VI, II-V, III-VI.

In one embodiment, the anisotropic flat colloidal semiconductor nanocrystal or the assembly of anisotropic flat colloidal semiconductor nanocrystals comprises semiconductors of group IV, group IIIA-VA, group IIA-VIA, group IIIA-VIA, group IA-IIIA-VIA, group IIA-VA, group IVA-VIA, group VIB-VIA, group VB-VIA, or group IVB-VIA.

In one embodiment, the anisotropic flat colloidal semiconductor nanocrystal comprises a material of the composition $M_xE_y$ where:

M is Zn, Cd, Hg, Cu, Ag, Al, Ga, In, Si, Ge, Pb, Sb or a mixture thereof,

E is O, S, Se, Te, N, P, As or a mixture thereof, and x and y are independently a decimal number of 0 to 5, and not simultaneously zero.

In one embodiment, the anisotropic flat colloidal semiconductor nanocrystal or the assembly of anisotropic flat colloidal semiconductor nanocrystals comprises a material of the composition $M_xE_y$ where:

M is Zn, Cd, Hg, Cu, Ag, Al, Ga, In, Si, Ge, Pb, Sb, Sn, Pd, Fe, Au, Ti, Bi, W, Mo, V or a mixture thereof, E is O, S, Se, Te, N, P, As or a mixture thereof, and x and y are independently a decimal number of 0 to 5, and not simultaneously zero.

In one embodiment, the anisotropic flat colloidal semiconductor nanocrystal or the assembly of anisotropic flat colloidal semiconductor nanocrystals comprises a material of the composition $M_xN_yE_z$, wherein:

M is selected from Zn, Cd, Hg, Cu, Ag, Al, Ga, In, Si, Sn, Ge, Pb, Sb, Sn, Pd, Fe, Au, Ti, Bi, W, Mo, V or a mixture thereof;

N is selected from Zn, Cd, Hg, Cu, Ag, Al, Ga, In, Si, Sn, Ge, Pb, Sb, Sn, Pd, Fe, Au, Ti, Bi, W, Mo, V or a mixture thereof;

E is selected from O, S, Se, Te, N, P, As or a mixture thereof; and x, y and z are independently a decimal number from 0 to 5, at the condition that when x is 0, y and z are not 0, when y is 0, x and z are not 0 and when z is 0, x and y are not 0.

According to one embodiment, the anisotropic flat colloidal semiconductor nanocrystal or the assembly of anisotropic flat colloidal semiconductor nanocrystals is made of a quaternary compound such as InAlGaAs, ZnAgInSe or GaInAsSb.

In one embodiment, the anisotropic flat colloidal semiconductor nanocrystal or the assembly of anisotropic flat colloidal semiconductor nanocrystals comprises at least one of the following: Si, Ge, CdS, CdSe, CdTe, ZnS, ZnSe, ZnTe, HgS, HgSe, HgTe, PbS, PbSe, PbTe, $CuInS_2$, $CuInSe_2$, $AgInS_2$, $AgInSe_2$, CuS, $Cu_2S$, $Ag_2S$, $Ag_2Se$, $Ag_2Te$, InN, InP, InAs, InSb, $In_2S_3$, $Cd_3P_2$, $Zn_3P_2$, $Cd_3As_2$, $Zn_3As_2$, ZnO, AlN, AlP, AlAs, AlSb, GaN, GaP, GaAs, GaSb, $FeS_2$, $TiO_2$, $Bi_2S_3$, $Bi_2Se_3$, $Bi_2Te_3$, $MoS_2$, $WS_2$, $VO_2$ or a mixture thereof.

In one embodiment, the anisotropic flat colloidal semiconductor nanocrystal or the assembly of at anisotropic flat colloidal semiconductor nanocrystal comprises an alloy of the materials listed above.

In one embodiment the anisotropic flat colloidal semiconductor nanocrystal comprises a nanocrystal or an initial nanosheet partially or totally covered on at least one side by at least a monolayer or a layer of an additional material.

In one embodiment where multiple monolayers or layers cover all or part of the nanocrystal or initial nanosheet, these single layers or layers can comprise the same material or different materials.

For the purposes of the present invention, the term "layer" refers to a film or a continuous or partial layer being at least one atom thick. The term "monolayer" refers to a film or a continuous or partial layer being one atom thick. The atoms constituting the layer or the monolayer may be the same or different.

In one embodiment, the anisotropic flat colloidal semiconductor nanocrystal is homostructured, i.e. the initial nanocrystal or nanosheet and the at least one monolayer or layer are made of the same material.

In one embodiment, the anisotropic flat colloidal semiconductor nanocrystal is heterostructured, i.e. the initial nanocrystal or nanosheet and the at least one monolayer or layer are composed of at least two different materials.

In one embodiment, the anisotropic flat colloidal semiconductor nanocrystal can comprise the initial nanocrystal or nanosheet and 1, 2, 3, 4, 5 or more monolayers or layers covering all or part of the initial nanocrystal or nanosheet, said monolayers or layers being of identical composition to the initial nanocrystal or nanosheet or being of different composition than that of the initial nanocrystal or nanosheet or being of different composition there between.

In one embodiment, the anisotropic flat colloidal semiconductor nanocrystal can comprise the initial nanocrystal or nanosheet and at least 2, 3, 4, 5 or more monolayers or layers, wherein the first monolayer or layer deposited covers all or part of the initial nanocrystal or nanosheet and the at least second monolayer or layer deposited covers all or part of the previously deposited monolayer.

In one embodiment, the anisotropic flat colloidal semiconductor nanocrystal has a core/shell structure, i.e. an initial nanocrystal or nanosheet of given composition covered over its entire surface by at least one monolayer or layer of different composition than that of the initial nanocrystal or nanosheet.

Thus, the material obtained is composed of a stack of films of which at least one is of identical chemical composition or different chemical composition than that of the initial nanocrystal or nanosheet, the surface of each film covering completely the surface of the film on which it is deposited.

In one embodiment, the anisotropic flat colloidal semiconductor nanocrystal comprises a de-wetted structure, i.e. an initial nanocrystal or nanosheet of a given composition partly covered by at least one monolayer or layer of the same composition or different composition than that of the initial nanocrystal or nanosheet.

Thus, the material obtained is composed of a stack of films of which at least one is of identical chemical composition or different chemical composition than that of the initial nanocrystal or nanosheet, the surface of each film partially covering the surface of the film on which it is deposited.

Thus, in one embodiment, the anisotropic flat colloidal semiconductor nanocrystal has a heterostructure comprising the materials listed above.

In one embodiment, the anisotropic flat colloidal semiconductor nanocrystal is doped with a lanthanide or a transition metal.

In one embodiment, the anisotropic flat colloidal semiconductor nanocrystal is covered by a semiconductor of different chemical composition.

In one embodiment, the anisotropic flat colloidal semiconductor nanocrystal is covered by organic molecules.

In one embodiment, the organic molecules are chosen between thiols, amines, carboxylic acids, phosphonic acids, phosphinic acids, phosphines.

In one embodiment, the anisotropic flat colloidal semiconductor nanocrystal is a colloidal semiconductor nanosheet.

In one embodiment, the anisotropic flat colloidal semiconductor nanocrystal displays a narrow fluorescence spectrum, of full width at half maximum less than 100 nm, than 75 nm, than 50 nm, than 40 nm, than 30 nm, than 25 nm, than 24 nm, than 23 nm, than 22 nm, than 21 nm or than 20 nm.

In one embodiment, the anisotropic flat colloidal semiconductor nanocrystal emits light at a wavelength between 350 and 1500 nm.

The present invention also relates to a component comprising at least one light-emitting device in response to the activation of excitation means, according to an embodiment of the invention, and a support for said at least one device, said support being transparent to the light emitted by the device in at least one direction towards an observer situated outside the component, the support surface through which light is emitted towards the observer being defined as emitting face.

Thus, for the purpose of the present invention, a component is defined as the combination of at least one light-emitting device in response to the activation of excitation means as described in the present invention and a support in which is placed said at least one device.

In one embodiment, the at least one light-emitting device in response to the activation of excitation means is in contact with the support.

In one embodiment, the at least one light-emitting device in response to the activation of excitation means is integrated in the support.

In one embodiment, the at least one light-emitting device in response to the activation of excitation means is in contact with a first support and covered by a second support; said first and second supports being of the same nature or of different nature.

The present invention also relates to a light-emitting system including a component as described in the present invention and at least one excitation device according to an embodiment of the invention wherein the excitation means of the at least one device are integrated into the support.

In one embodiment, the excitation means of the at least one device are integrated into the support.

In one embodiment, the excitation means of the at least one device are external to the support.

In one embodiment, the component comprises at least two devices sharing the same excitation means.

In one embodiment, the support comprises a liquid.

In one embodiment, the liquid has properties of liquid crystals.

In one embodiment, the support comprises at least one organic material.

In one embodiment, the support comprises at least one organic semiconducting material.

In one embodiment, the support comprises a polymer material.

In one embodiment, the support is rigid.

In one embodiment, the support is flexible. In one embodiment, the polymer is a polyelectrolyte.

In one embodiment, the polymer comprises chemical functions capable of substituting themselves to the surface ligands of the nanocrystals.

In one embodiment, the polymer is a poly(methyl methacrylate), a polystyrene, a polycarbonate, a polyethylene, a polyethylene terephthalate, an epoxide, a polyester, a polysiloxane.

In one embodiment, the polymer comprises a semiconducting polymer.

In one embodiment, the polymer comprises polythiophene, P3HT, MDMO PPV, MEH-PPV, PEDOT, PEDOT: PSS, PCBM, PCNEPV, polyfluorene, PSS.

In one embodiment, the support comprises at least one inorganic material.

In one embodiment, the inorganic material is a semiconductor.

In one embodiment, the semiconductor comprises at least one of the following: CdS, CdSe, CdTe, ZnS, ZnSe, ZnTe, AlN, GaN, InN, AlP, GaP, InP, AlAs, GaAs, InAs, C, Si, Ge.

In one embodiment, the preferred anisotropic flat colloidal semiconductor nanocrystal is a CdSe core with a CdZnS shell.

In one embodiment, the semiconductor is doped, it contains in minor amounts an element producing an excess or a default of electrons compared to the sole semiconductor.

In one embodiment, the inorganic material is a glass such as silica.

In one embodiment, the inorganic material comprises an oxide chosen from: $TiO_2$, ITO (indium oxide doped with tin), NiO, ZnO, $SnO_2$, $SiO_2$, $ZrO_2$, FTO (tin oxide doped with fluorine).

In one embodiment, the inorganic material is a metal.

In one embodiment, the component comprises at least two devices, the at least two anisotropic flat colloidal semiconductor nanocrystals of the at least two devices having different characteristics. In a preferred embodiment, the component comprises at least two devices, the at least two assemblies of anisotropic flat colloidal semiconductor nanocrystals of the at least two devices having different characteristics.

In one embodiment, said characteristics are the dimensions.

In one embodiment, said characteristics are the chemical compositions.

In one embodiment, said characteristics are the emission wavelengths.

In one embodiment, the component is characterized in that it comprises at least two flat nanocrystals, the normals to the surfaces of the at least two flat nanocrystals being substantially parallel to a given direction.

In one embodiment, the component is characterized in that it comprises at least two flat nanocrystals, the normals to the surfaces of the at least two flat nanocrystals being substantially perpendicular to a given direction.

In one embodiment, substantially all of the flat nanocrystals of the component have their normal to their surfaces substantially parallel to a given direction.

In one embodiment, substantially all of the flat nanocrystals of the component have their normal to their surfaces substantially perpendicular to a given direction In one embodiment, the normal to the surface of the at least one flat nanocrystal of the component is substantially parallel to the normal of the emitting face.

In one embodiment, the normal to the surface of the at least one flat nanocrystal of the component is substantially perpendicular to the normal of the emitting face.

In one embodiment, the normals to the surface of more than 50%, 55%, 60%, 65%, 70%, 75%, 80%, 85%, 90%, or 95% of flat nanocrystals of the assembly of the component is substantially parallel to the normal of the emitting face.

In one embodiment, the normals to the surface of more than 50%, 55%, 60%, 65%, 70%, 75%, 80%, 85%, 90%, or 95% of flat nanocrystals of the assembly of the component is substantially perpendicular to the normal of the emitting face.

In one embodiment, the support of the component comprises means to orient the at least one flat nanocrystal according to at least one preferred direction. In one embodiment, the support of the component comprises means to orient the at least one assembly of flat nanocrystals according to at least one preferred direction.

In one embodiment, the component is made by a process wherein the flat nanocrystals are deposited on a support surface with the normal to their surface substantially parallel to the normal to the support surface.

In one embodiment, the component is made by a process wherein more than 50%, 55%, 60%, 65%, 70%, 75%, 80%, 85%, 90%, or 95% of flat nanocrystals of the assembly are deposited on a support surface with the normal to their surface substantially parallel to the normal to the support surface.

In one embodiment, the component is made by a process wherein the flat nanocrystals are deposited on a support surface with the normal to their surface substantially perpendicular to the normal to the support surface.

In one embodiment, the component is made by a process wherein more than 50%, 55%, 60%, 65%, 70%, 75%, 80%, 85%, 90%, or 95% of flat nanocrystals of the assembly are deposited on a support surface with the normal to their surface substantially perpendicular to the normal to the support surface.

In one embodiment, the component is made by a process wherein the support surface comprises a texturing.

In one embodiment, the component is made by a process comprising a slow evaporation phase of a solution containing the flat nanocrystals.

In one embodiment, the slow evaporation phase is realized while applying an electric field.

In one embodiment, the component is made by a process comprising a step of depositing the flat nanocrystals by spin coating a solution containing the flat nanocrystals.

In one embodiment, the component is made by a process comprising a step of depositing the flat nanocrystals by dip coating of the substrate in a solution containing the flat nanocrystals.

In one embodiment, the solution containing the flat nanocrystals comprises also an organic compound such as a polymer or a monomer.

In one embodiment, the component is made by a process comprising a step of layer-by-layer electrostatic adsorption of the flat nanocrystals having a surface charge.

In one embodiment, the component is made by a process comprising the transfer of a film of oriented flat nanocrystals previously formed.

In one embodiment, the film of nanocrystals is obtained by slow evaporation on a liquid surface of a solution containing the nanocrystals.

The present invention also relates to a method for manufacturing the component according to an embodiment of the invention in which the flat nanocrystals are deposited on a support surface with the normal to their surface substantially parallel to the normal to the surface support.

Within the purpose of the present invention substantially parallel or substantially perpendicular means that the angle formed by the normals to the two surfaces is +40° to −40°, or +30° to −30°, or +20° to −20°, or +10° to −10°, or +5° to −5°.

The present invention also relates to an apparatus comprising at least one component and/or a system wherein means are provided to activate each component and/or system by excitation means, independent one another.

In one embodiment, the activation means of the apparatus are of electric type and comprise at least two electrodes arrays in a matrix arrangement.

In one embodiment, the activation means are provided in the apparatus for applying to the electrodes electric signals multiplexed in time.

In one embodiment, each of the components and/or systems of the apparatus is associated to an electronic component of transistor type placed on the spots of the matrix of the matrix arrangement.

Other features and advantages of the device according to the invention will become apparent upon reading the detailed description and examples given below for illustrative purposes only.

Figure 1:
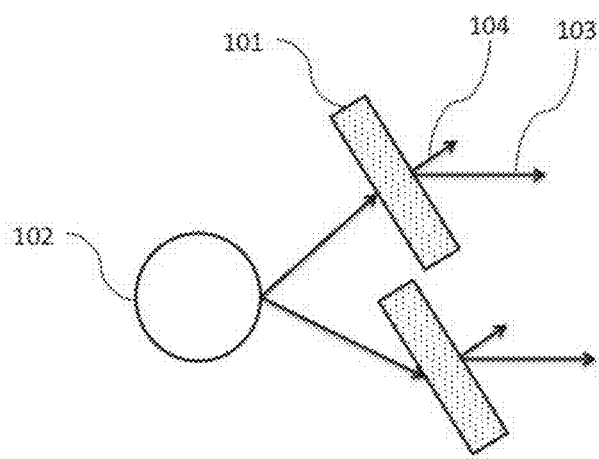
FIG. 1 shows a diagram of an embodiment of the device as described in the invention

A first embodiment of a device for emitting light in response to the activation of excitation means according to the invention is shown in FIG. 1. In the following, we denote by a flat nanocrystal an anisotropic colloidal semiconductor nanocrystal whose smallest dimension, the thickness, is smaller than the other two by a factor of at least 1.5. We denote by sheet a flat nanocrystal having at least one dimension, the thickness, of nanometric size and large lateral dimensions compared to the thickness, typically more than 5 times the thickness. We denote the normal to the flat nanocrystal the normal to the largest flat surface of the nanocrystal.

This device comprises at least one flat nanocrystal 101, and an excitation means 102 thereof. The light emitted by the device has an intensity and polarization that vary according to the angle formed by the light emission direction 103 and the normal to the largest flat surface of the nanocrystal 104. In one embodiment, the device comprises at least one assembly of flat nanocrystals.

Flat nanocrystals are fluorophores whose emission wavelength can be selected with precision throughout the visible spectrum simply by changing the composition and structure of said flat nanocrystals.

Dispersed in a transparent matrix, the flat nanocrystals are capable of absorbing any light radiation of wavelength less than their fluorescence wavelength and of re-emitting radiation at the fluorescence wavelength. These are thus wavelength converters. All the flat nanocrystals, whatever their composition and their fluorescence wavelength, have a high absorption cross section in the ultraviolet and blue. It is thus possible to excite with a same ultraviolet or blue radiation different types of flat nanocrystals that fluoresce in the blue, green and red for example.

The fluorescence of a semiconductor nanocrystal comes from the recombination of an exciton in said nanocrystal. Given the nanometric size of the nanocrystal, a quantum confinement effect is exerted on the exciton and shifts towards the blue the fluorescence wavelength with respect to the exciton in the absence of confinement. The smaller the nanocrystal, the stronger the confinement effect that shifts towards the blue the fluorescence wavelength.

Figure 2:
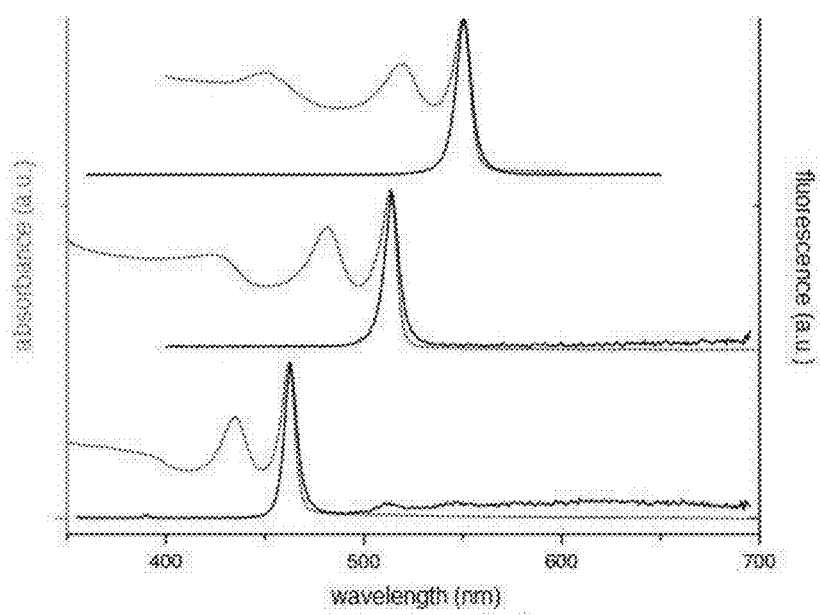
FIG. 2 shows the absorbance and fluorescence spectra of three populations of CdSe nanosheets emitting at 460, 512 and 550 nm.

In the particular case of sheets, the thickness being much smaller than the lateral dimensions of the nanocrystal, the quantum confinement effect is felt in the thickness only. In addition, in the sheets, the thickness can be well defined, at the atomic monolayer level. The combination of quantum confinement in one dimension only and perfect thickness control allows achieving the narrowest spectral fluorescence ever reported for isotropic semiconductor nanocrystals. Thus, as described in patent WO2010/029508 an ensemble of colloidal sheets of semiconductor may have a very narrow fluorescence spectrum, the full width at half maximum of the fluorescence peak being less than 12 nm. Examples of absorbance and fluorescence spectra of solutions of colloidal sheets of semiconductors are shown in FIG. 2.

Figure 3A:
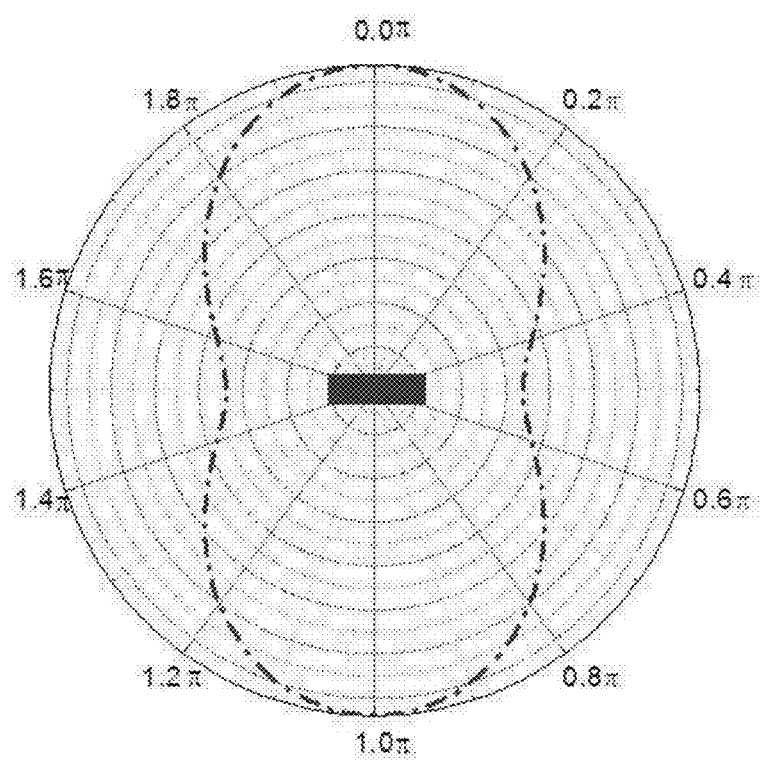
FIG. 3A shows the radiation diagram of an anisotropic flat colloidal nanocrystal.
Figure 3B:
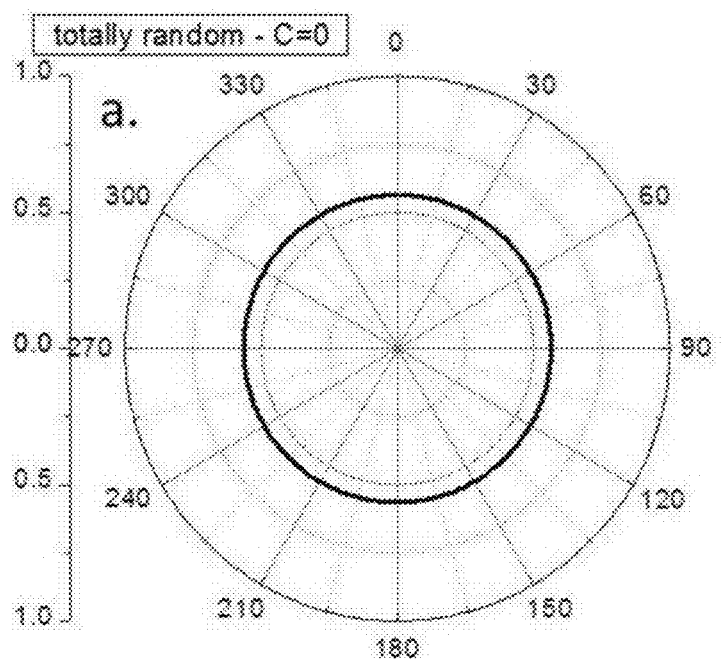
FIG. 3B shows the radiation pattern for an assembly of nanocrystals with a certain number of flat nanocrystals oriented in the same direction. If all nanocrystals have a random direction the radiation pattern is isotropic. On the other hand if all the nanocrystals are oriented on the same direction, the pattern is the same as for a single nanocrystal the radiation diagram of an anisotropic flat colloidal nanocrystal
Figure 3B:
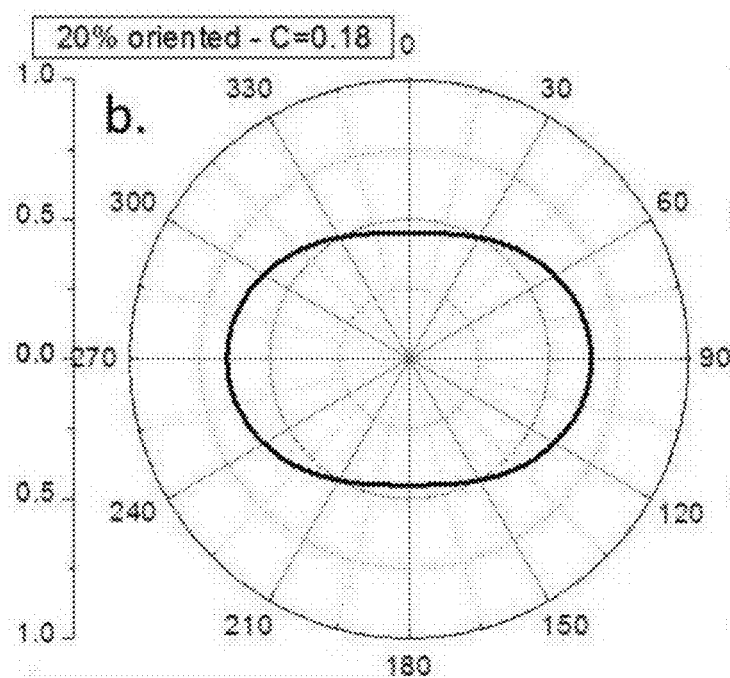
Figure 3B:
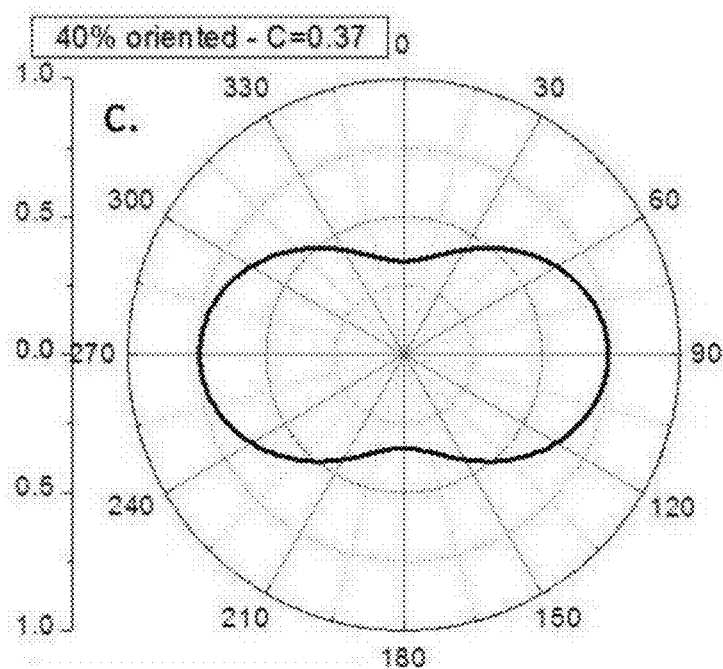
Figure 3B:
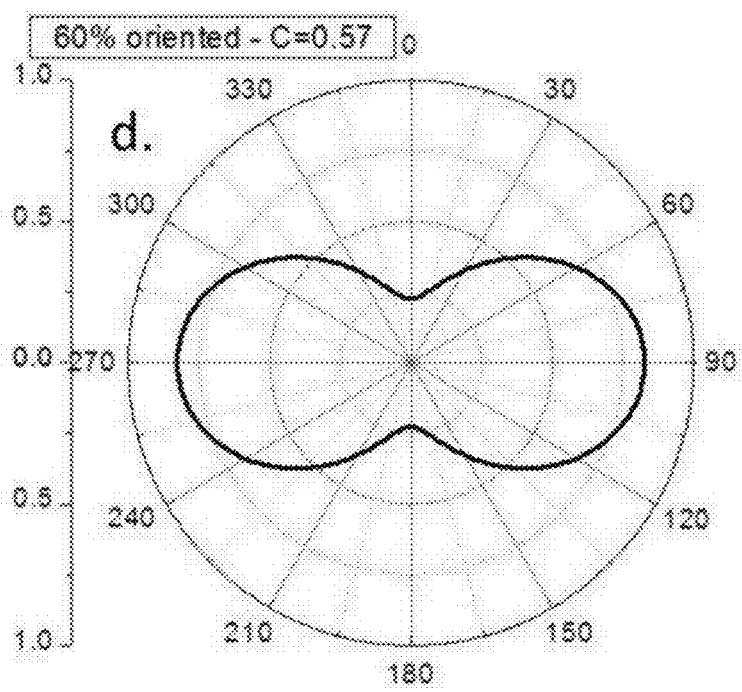
Figure 3B:
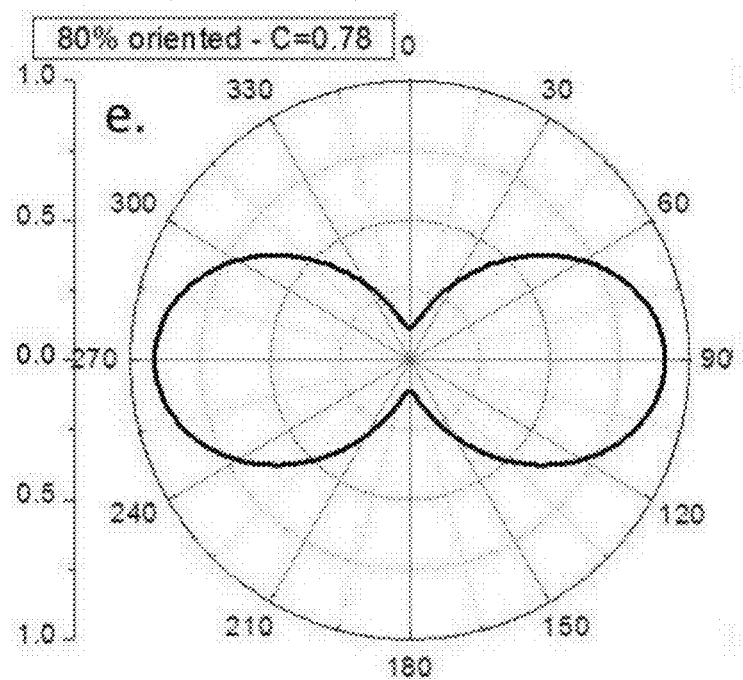
Figure 3B:
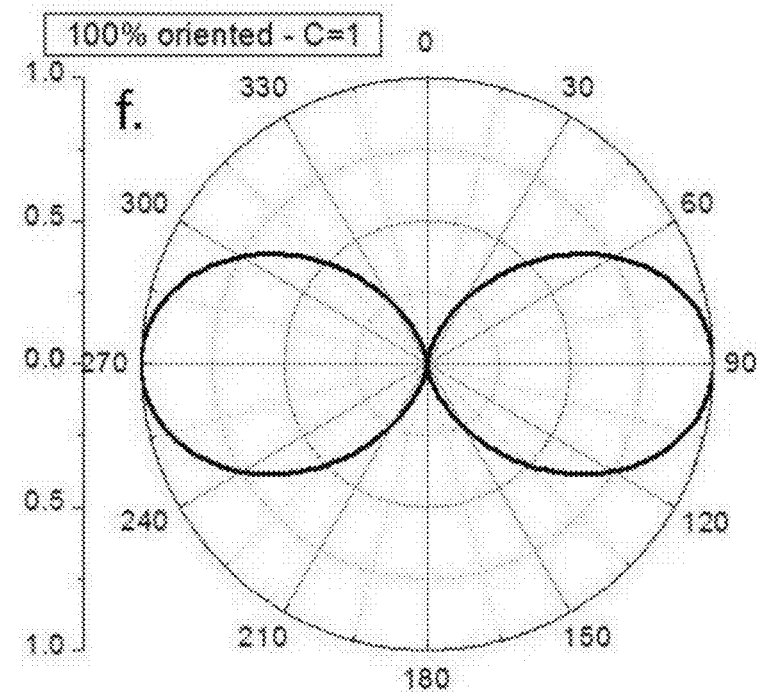
Figure 3C:
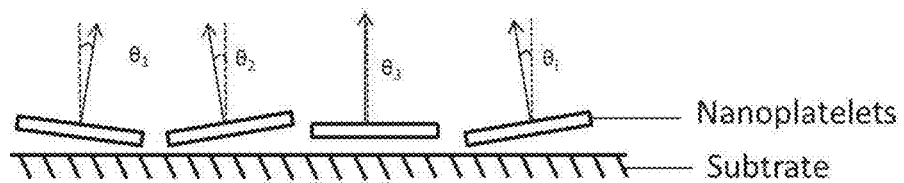
FIG. 3C shows a scheme of flat nanocrystals lying on a substrate with a small tilt of their normal direction compared to the normal to the substrate.
Figure 3D:
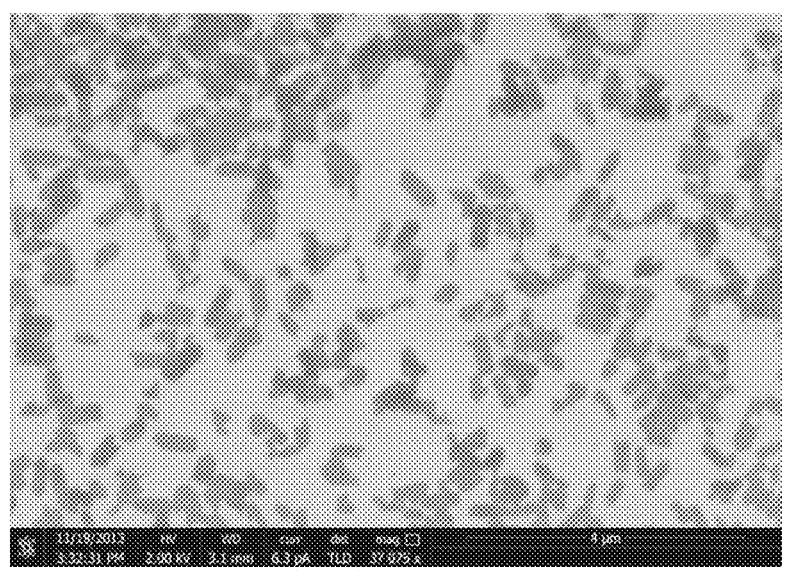
FIG. 3D shows a scanning electron microscope image of CdTe nanoplatelets on a graphene substrate, wherein all nanoplatelets lie on the same facet.
Figure 3E:
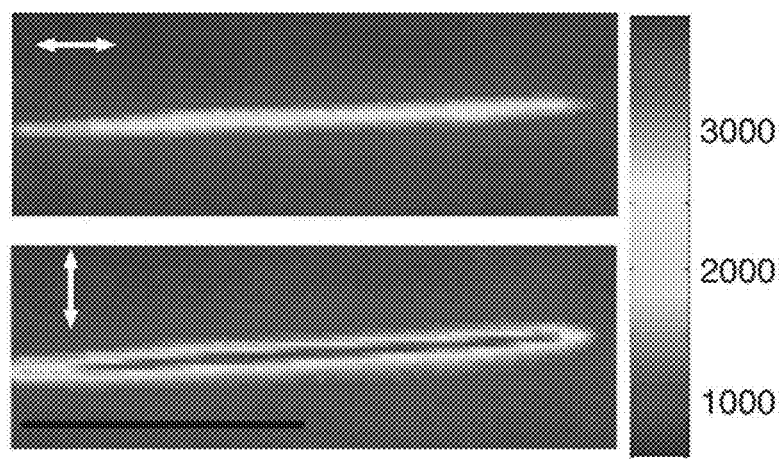
FIG. 3E shows fluorescence intensity in false color for an assembly of nanoplatelets oriented in a given direction (perpendicular to the needle direction) depending on the polarization direction. Scale bar is 10 µm.

The inventors have found that the flat nanocrystals have a particular radiation pattern, shown in FIGS. 3A and 3B. A maximum is observed in a preferred direction, i.e. normal to the surface of the flat nanocrystal.

The inventors have also found that, in this preferred emission direction, the light emitted by the flat nanocrystal presents no particular polarization but, conversely, the light emitted in the plane of the flat nanocrystal has a linear polarization following said flat nanocrystal plane.

Devices, components and apparatus as will be described in the following exploit these two properties.

The excitation means of the device according to the invention can be of several kinds.

Figure 4:
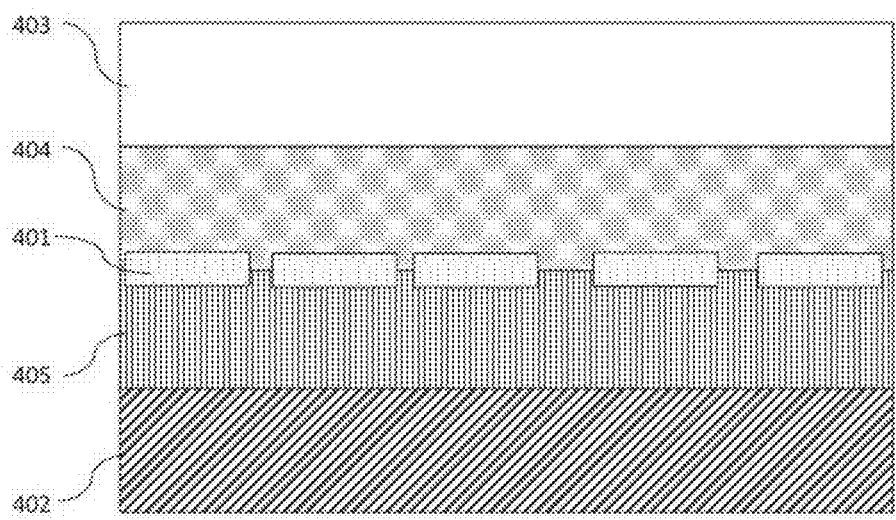
FIG. 4 shows a sectional view of the schematic structure of a light-emitting diode containing anisotropic flat colloidal nanocrystals, as described in an embodiment of the invention.

They may comprise means of injecting electric charges, electrons and/or holes, in the flat nanocrystal as shown schematically in FIG. 4. The electrons and/or holes are injected into the flat nanocrystal 401 through electrodes 402 and 403, of which at least one 403 is transparent in the spectral range of the light emitted by the nanocrystal and of supports 404 and 405, here semiconducting layers respectively of n-type and p-type deposited on both sides of a layer of the nanocrystals 401.

This excitation means corresponds in particular to light-emitting diodes. It may also correspond to the AC-TFEL devices (Alternating Current Thin Film Electroluminescence) in which the charges are generated in an alternating of insulating and emissive films by the application of an alternating high voltage. The alternating electric field induced by the applied voltage generates charges, especially at the insulator/luminescent compounds interfaces.

The excitation means of the device may comprise means for applying to the flat nanocrystal an electromagnetic field, or electromagnetic waves such as light waves selected such that at least part of said waves are absorbed by the flat nanocrystal. The exciting means corresponds in particular to wavelength converters containing fluorescent nanocrystals: they absorb some or all of the excitation light and emit light at another wavelength, generally higher that the length of excitation.

The excitation means of the device may comprise at least one electric or magnetic dipole coupled by electromagnetic interactions to the flat nanocrystal. This excitation means corresponds in particular to FRET (Förster Resonance Energy Transfer) type excitations. In this case, a donor fluorophore, initially in an excited electronic state can transfer its energy to an acceptor fluorophore through a non-radiative dipolar coupling. The donor fluorophore can be composed of organic fluorophores, fluorescent semiconductor nanocrystals or even quantum wells in an excited state.

The flat nanocrystal can comprise group IV, group IIIA-VA, group IIA-VIA, group IIIA-VIA, group IA-IIIA-VIA, group IIA-VA, group IVA-VIA, group VIB-VIA, group VB-VIA, or group IVB-VIA or/and group II-VI, III-V, IV-VI, II-V or I-III-VI semiconductors. In particular, it can contain at least one of the following: Si, Ge, Sn, CdS, CdSe, CdTe, ZnS, ZnSe, ZnTe, HgS, HgSe, HgTe, PbS, PbSe, PbTe, CuInS$_2$, CuInSe$_2$, AgInS$_2$, AgInSe$_2$, CuS, Cu$_2$S, Ag$_2$S, Ag$_2$Se, Ag$_2$Te, InN, InP, InAs, InSb, In$_2$S$_3$, Cd$_3$P$_2$, Zn$_3$P$_2$, Cd$_3$As$_2$, Zn$_3$As$_2$, ZnO, AlN, AlP, AlAs, AlSb, GaN, GaP, GaAs, GaSb, FeS$_2$, TiO$_2$, Bi$_2$S$_3$, Bi$_2$Se$_3$, Bi$_2$Te$_3$, MoS$_2$, WS$_2$, VO$_2$.

The flat nanocrystal can be doped with a lanthanide or a transition metal.

In one embodiment, the flat nanocrystal is covered with another semiconductor of different chemical composition. This type of structures is generally named core/shell.

Figure 5A:
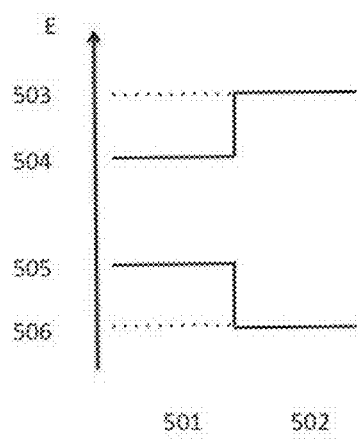
FIGS. 5a and 5b show an example of a band structure of the semiconductors composing a core/shell heterostructure of type I and type II.

FIG. 5a shows an example of the band structure of semiconductors composing a core 501/shell 502 type I heterostructure. When the energy level of the conduction band of the semiconductor forming the shell 503 is higher than the energy level of the conduction band of the semiconductor forming the core 504 and the energy level of the valence band of the semiconductor forming the shell 505, is lower than the energy level of the valence band of the semiconductor forming the core 506, the bandgap of the semiconductor composing the shell is of greater width that the bandgap of the semiconductor composing the core, which leads to the formation of a type I heterostructure, which confines the electron and hole forming the exciton in the heart of the heterostructure.

Figure 5B:
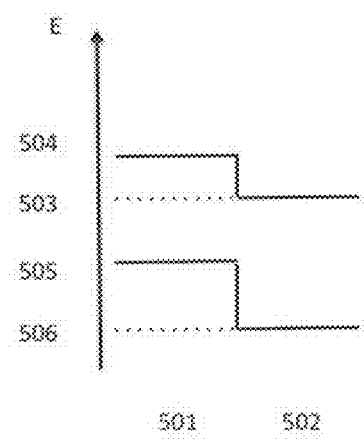

FIG. 5b shows an example of the band structure of semiconductors composing a core 501/shell 502 type II heterostructure. When the energy level of the conduction band of the semiconductor forming the shell 503 is lower than the energy level of the conduction band of the semiconductor forming the core 504 and the energy level of the valence band of the semiconductor forming the shell 505 is lower than the energy level of the valence band of the semiconductor forming the core 506, the heterostructure is called type II. There is spatial separation of the electron and the hole, the latter being located mainly in the core or the shell.

The shell thickness may vary from one atomic monolayer to several tens of nanometers. Furthermore, it may be of uniform thickness throughout the whole nanocrystal, or conversely of heterogeneous thickness, being thicker on the large faces of the anisotropic flat nanocrystal than on the smaller faces, or vice versa.

The flat nanocrystal can be covered by organic molecules. Said organic molecules can play the role of surface ligands, i.e. a function present on the organic molecule may adsorb on the surface of the nanocrystal. The adsorption of these ligands changes the fluorescence properties of the anisotropic flat colloidal semiconductor nanocrystal; their adsorption also provides colloidal stability of the nanocrystals. The organic molecules are selected from thiols, amines, carboxylic acids and phosphines.

In one embodiment of the invention, the flat nanocrystal comprises a colloidal semiconductor sheet. We denote as sheet a flat nanocrystal having at least one dimension, the thickness, of nanometric size and large lateral dimensions compared with the thickness, typically more than 5 times the thickness. The flat nanocrystal can be itself a sheet. The flat nanocrystal can alternatively comprise a sheet in a core/shell structure, for example.

Figure 6:
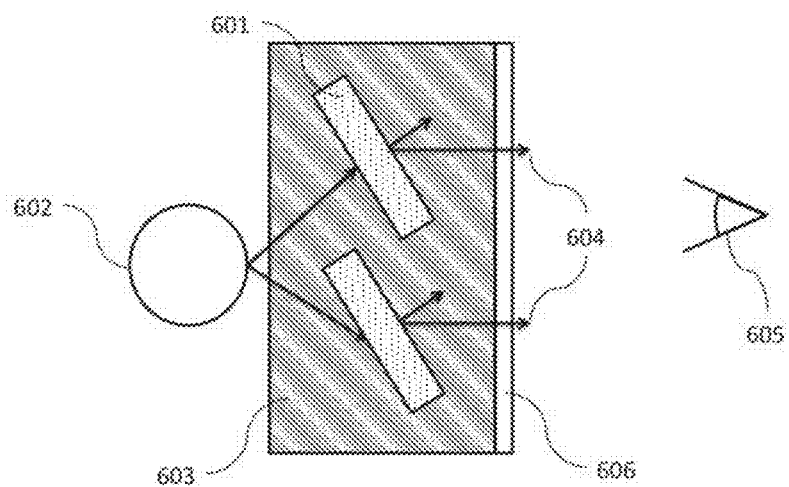
FIG. 6 shows sectional views of schematic structures of an example of a component as described in an embodiment of the invention.

In a second embodiment of the invention, a component is formed as shown in FIG. 6, comprising at least one device, itself comprising at least one flat nanocrystal 601, and a means of excitation 602 thereof. This at least one device is placed in a support 603, said support being transparent to the light emitted by the device in at least one direction 604 towards an observer 605 located outside of the component, the support surface through which light is emitted towards the observer is defined as emitting face 606.

The excitation means of the device may be integrated to the support or alternatively, the excitation means of the at least one device may be external to the substrate.

The component may comprise one or more devices and therefore one or several nanocrystals. In addition, in a component which comprises at least two devices, the means of excitation of said devices may be shared or not.

Figure 7A:
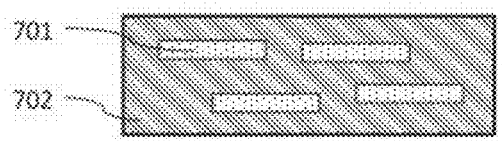
FIGS. 7a, 7b and 7c present sectional views of schematic structures of supports containing flat nanocrystals as described in an embodiment of the invention.

The component comprises a support in which is placed the at least one device, said support may be formed in various ways. It can for example be made of an organic material, for example a polymer or an inorganic material; it can be made, as shown schematically in FIG. 7a of one sole material 702 in which the nanocrystals 701 are dispersed.

It may also comprise several different materials forming several layers.

Figure 7B:
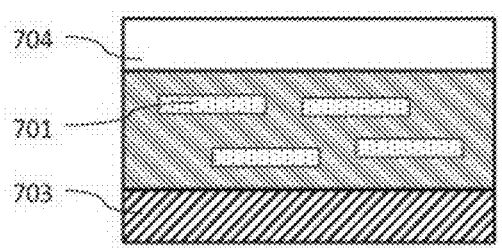
Figure 7C:
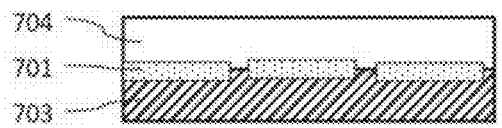

In FIG. 7b, the nanocrystals are located within one of the layers and, in FIG. 7c; they are located at the interface between two different layers.

The support is transparent in at least one direction for the light emitted from the nanocrystals, which implies that some of the layers 703 may be opaque or reflective to the light emitted from the nanocrystals, while another portion 704 must be transparent therefor. Depending on the excitation means used, the support can also be transparent with respect to excitation light of the nanocrystals. Finally, following other means of excitation used, the support may comprise electrodes as well as organic or inorganic semiconducting layers.

The support may be made in various ways: it may contain a liquid, particularly a liquid with properties of liquid crystals.

It may also comprise at least one organic material such as a well-known material for the production of light-emitting diodes with small molecules such as Alq3.

The support may contain at least one polymer material:
The polymer may comprise chemical functions capable of substituting themselves to the surface ligands of the nanocrystals.
The polymer may be a polyelectrolyte.
The polymer may be a poly(methyl methacrylate), a polystyrene, a polycarbonate, a polyethylene, a polyethylene terephalate, an epoxide, a polyester, a polysiloxane.
The polymer may be a semiconducting polymer such as a polythiophene, P3HT, MDMO PPV, MEH-PPV, PEDOT, PEDOT:PSS, PCBM, PCNEPV, polyfluorene, PSS.
The support may comprise an inorganic material:
The inorganic material may be a semiconductor such as a II-VI semiconductor: CdS, CdSe, CdTe, ZnS, ZnSe, ZnTe, III-V:AlN, GaN, InN, AlP, GaP, InP, AlAs, GaAs, InAs and alloys thereof, an intrinsic semiconductor such as carbon, silicium or germanium.
The semiconductor may be doped.
The inorganic material may be a glass such as silica.
The inorganic material may be an oxide: TiO2, ITO (indium oxide doped with tin), NiO, ZnO, SnO2, SiO2, ZrO2.
The inorganic material may be a metal: gold, silver, molybdenum, aluminum . . . .

In one embodiment of the invention, a component may comprise at least two devices, the at least two anisotropic flat colloidal semiconductor nanocrystals of the least two devices having different characteristics. In one embodiment of the invention, a component may comprise at least two devices, the at least two assemblies of anisotropic flat colloidal semiconductor nanocrystals of the least two devices having different characteristics. Said characteristics may be the dimensions or chemical compositions. This allows defining a component featuring two distinct populations of nanocrystals that emit at two different wavelengths.

The peculiar emission diagram of the flat colloidal semiconductor can be utilized if the nanocrystals of the component are oriented. It is possible to define their orientation either relative to the other nanocrystals present in the component or relative to the emitting face of the component. For this it is necessary to introduce a normal to the anisotropic flat colloidal semiconductor nanocrystal, which will fully define the orientation of the nanocrystals. The normal to the nanocrystal is defined as the normal to the largest surface of the flat nanocrystal.

Figure 8A:
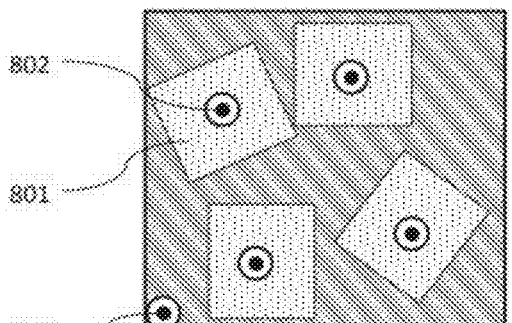
FIGS. 8a and 8b are schematic views, respectively from above and sectional, of an embodiment of a component in which the normal to the nanocrystals is substantially parallel to the normal to the emitting face.
Figure 8B:
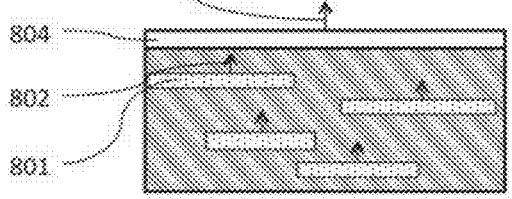

If one orients the nanocrystals relative to the emitting face, one can define a component wherein the normal to at least one nanocrystal is substantially parallel to the normal to the emitting face, as shown in FIG. 8a as seen from above and in cross section FIG. 8b. If the flat nanocrystals 801 are all oriented in the component so that the normals to the flat nanocrystals 802 are all aligned and parallel to the normal 803 to the emitting face 804, one will have en emitter emitting predominantly in the direction of the incident beam, but the reemitted radiation will not be polarized. In one embodiment, more than 50%, 55%, 60%, 65%, 70%, 75%, 80%, 85%, 90%, or 95% of the anisotropic flat colloidal semiconductor nanocrystals of the assembly have their normal 802 substantially parallel to the normal of the emitting face 804.

Figure 9A:
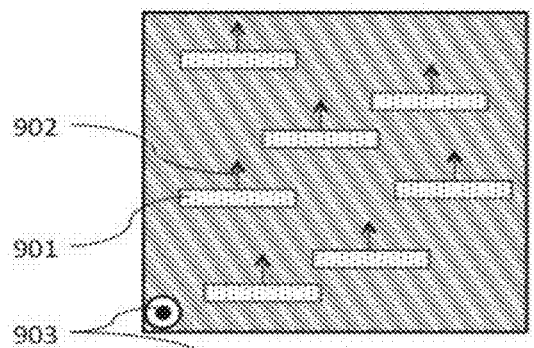
FIGS. 9a and 9b are schematic views, respectively from above and sectional, of an embodiment of a component in which the normal to the nanocrystals is substantially perpendicular to the normal to the emitting face.
Figure 9B:
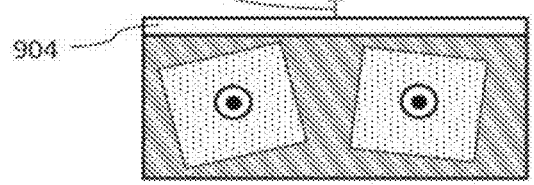

Similarly, if one orients the nanocrystals relative to the emitting face, one can define wherein the normal to at least one nanocrystal is substantially perpendicular to the normal to the emitting face, as shown in FIG. 9a as seen from above and in cross section FIG. 9b. If the flat nanocrystals 901 are all oriented within the component so that the normals to the flat nanocrystals 902 are all aligned and perpendicular to the normal 903 to the emission surface 904, one will have an emitter emitting a linearly polarized radiation. In one embodiment, more than 50%, 55%, 60%, 65%, 70%, 75%, 80%, 85%, 90%, or 95% of the anisotropic flat colloidal semiconductor nanocrystals of the assembly have their normal 902 substantially perpendicular to the normal of the emission surface 904.

Intermediate orientation situations give rise to components reemitting a light partially polarized and/or with a less pronounced directivity.

To orient the nanocrystals with respect to each other, the component must contain at least two nanocrystals, the normals to the surfaces of the at least two nanocrystals being substantially parallel to a given direction. In particular, substantially all of the component's nanocrystals have their normal to their surface substantially parallel to a given direction. This case is shown in particular in FIGS. 8 and 9, wherein all of the nanocrystals of the component have the normals to their surfaces substantially parallel to a given direction, said direction being respectively either the normal to the emission surface of the component or a perpendicular to the emission surface of the component. In one embodiment, more than 50%, 55%, 60%, 65%, 70%, 75%, 80%, 85%, 90%, or 95% of the anisotropic flat colloidal semiconductor nanocrystals of the assembly of the component have the normal to their surface substantially perpendicular or substantially parallel to a given direction, said direction being preferably either the normal to the emission surface of the component or a perpendicular to the emission surface of the component.

To orient the nanocrystals within the component, the support may comprise means for orienting them according to at least one preferred direction.

Figure 10:
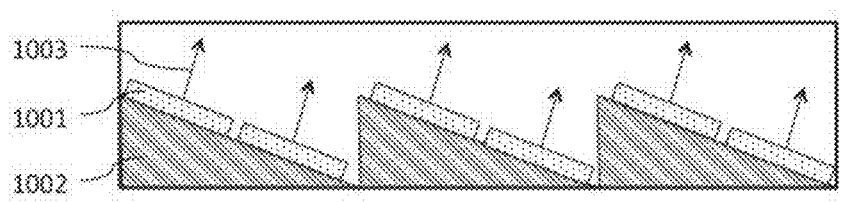
FIG. 10 is a schematic diagram in cross section of an example of an orientation means of the sheets in regard to the emitting face.

Due to the flat shape of the nanocrystals, they can deposit flatly on surfaces. A first means for orientating flat nanocrystals is presented in FIG. 10 is to deposit them on a surface 1002 of given orientation located in the support, the nanocrystals 1001 will deposit flatly on said surface, the normal of the nanocrystals 1003 will thus be parallel to the normal to the surface. The methods of manufacturing a component comprising oriented nanocrystals may involve a support surface within the component on which the nanocrystals are deposited.

It is possible to implement a process for manufacturing a component in which the nanocrystals are deposited on a support surface with the normal to their surface substantially parallel to the normal to the support surface.

It is possible to implement a process for manufacturing a component in which the support surface comprises a texturing. Indeed, the support surface may not be flat but microstructured for example. A blazed grating for example, would allow to predominantly orient the nanocrystals according to an angle corresponding to the angle of the blazed grating.

To make a component integrating oriented nanocrystals, it can be advantageous to deposit the nanocrystals on a substrate by a method that allows flat nanocrystals to settle flatly on the substrate. The process of manufacturing the component may comprise:
- a step of depositing the nanocrystals by slow evaporation on the substrate of a solution containing them,
- a step of depositing the nanocrystals by spin coating,
- a step of depositing the nanocrystals by dip coating
- a step of depositing the nanocrystals through layer-by-layer electrostatic adsorption.

Alternatively, a film of oriented nanocrystals can be prepared beforehand and then transferred onto a substrate. In this case, and depending on the mode of preparation of the film, it may comprise nanocrystals either predominantly horizontal or predominantly vertical relative to the film itself. It is possible to implement a process of manufacturing the component comprising a step of depositing the nanocrystals by formation and transfer of a Langmuir-Blodgett or Langmuir-Schaefer film.

Finally, it may be useful to deposit on the flat nanocrystals a protective layer, a glass or a polymer, for example. Said process being repeatable in order to form multilayers "matrix/flat nanocrystals" composites.

An alternative to orient the nanocrystals is to prepare beforehand a solution containing the flat nanocrystals and a polymer or a polymer precursor then polymerize and/or evaporate the solvent in the presence of an electric field.

Figure 11:
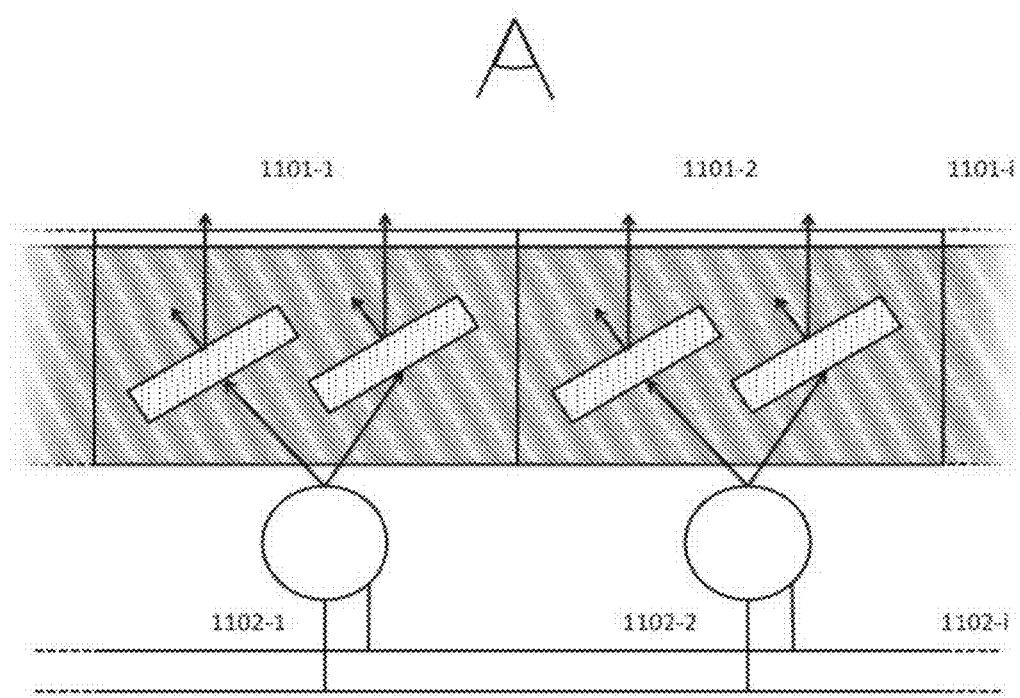
FIG. 11 shows an embodiment of a device such as a display comprising several components.

Another alternative to orient the nanocrystals is to prepare beforehand a thermoformable polymer/flat nanocrystal composite, the flat nanocrystals will orient in the matrix due to stress applied during the shaping of the composite. In a third embodiment, an apparatus is realized as shown in FIG. 11, comprising at least one component 1101-i as described above, each component may be subjected to activation means 1102-i independently one another. Such a device can be a display for presenting to an observer images, text or other visual information. The activation of the excitation means of the devices forming the apparatus is typically done using an electric current. To this end, an apparatus in which the means of activation are of electric type may comprise at least two networks of electrodes in a matrix arrangement. Moreover, means can be provided for applying to the electrodes electric signals multiplexed in time. The apparatus can also be constructed so that each component is associated with a transistor type electronic component placed at spots of the matrix in the matrix arrangement.

This addressing can be done in any known manner. For example, in the case of a LED display, it is the diodes themselves that are addressed matrix-wise. In the case of a display with a common lighting to all pixels, such as a liquid-crystal display device, it is the shutters that are addressed matrix-wise.

Due to the narrow full width at half maximum of the fluorescence peak of anisotropic flat semiconductor nanocrystals in general and sheets in particular, the device may have a very narrow emission spectrum width a full width at half maximum of the emission peak lower than 20 nm.

EXAMPLES

Example 1

Synthesis of Flat Core/Shell Fluorescent Nanocrystals

We describe for example, the synthesis of flat semiconductor fluorescent nanocrystals with a core/shell structure.

Synthesis of Sheets Emitting at 510 nm:

The CdSe sheets for example can be obtained by any know method, such as described for example in the following documents: Ithurria, S.; Dubertret, B. *Journal of the American Chemical Society* 2008, 130, 16504-5 and Ithurria, S.; Bousquet, G.; Dubertret, B. *Journal of the American Chemical Society* 2011, 133, 3070-7. 174 mg of $Cd(myristate)_2$ and 12 mg of Selenium powder are introduced in a three-necked-flask containing 16 mL of 1-octadecene (ODE, 90%). The flask is degassed under reduced pressure and under stirring at room temperature for 30 minutes. Argon is introduced in the flask which is then heated. When the temperature reaches 200° C., 40 mg of $Cd(Acetate)_2(H_2O)_2$ are swiftly introduced in the reaction medium inducing the growth of the sheets. The reaction medium is heated at 240° C., temperature at which it is maintained for approximately 10 minutes in order to allow the growth of the sheets. The solution is then cooled down and washed by successive precipitations and suspensions. The first precipitation is done by addition of oleic acid (approx. 10 mL), a non-solvent: ethanol (approx. 70 mL) and centrifugation (5000 rpm for 10 minutes). The supernatant is discarded and the precipitate is suspended in hexane (approx. 10 mL). The solution containing the sheets still contains a large quantity of $Cd(myristate)_2$ used in excess. Addition of a few milliliters of octylamine (4 mL) allows its dissolution. The suspension of platelets is then precipitated a second time by addition of ethanol (80 mL) and centrifugation. The suspension/precipitation process is repeated again twice with octylamine and a last time simply by suspension in hexane and precipitation with ethanol. The final precipitate is suspended in 10 mL of hexane.

Treatment Aiming at Increasing the Fluorescence Quantum Yield:

After the successive washing steps, the synthesized sheets exhibit a weak fluorescence (quantum yield less than 1%). It is possible to have them recover a high quantum yield (several tens of percent) by a modification of the surface ligands. To the solution of sheets in hexane is added 200 μL of oleic acid and 20 mg of $Cd(Acetate)_2(H_2O)_2$. The solution is then heated at reflux for 2 hours.

Growth of a Shell on the Initial Sheets:

We describe for example the deposition of a film of $Cd_{0.7}Zn_{0.3}S$ on the initial CdSe sheets.

In a vial are introduced successively 2 mL of chloroform, 400 μL of the CdSe sheets solution, 20 mg of thioacetamide (TAA) and 200 μL of octylamine. The solution is placed under magnetic stirring for one hour, which causes the complete dissolution of the TAA then a color change of the solution. 4 mg of $CdCl_2$ and 3 mg of $Zn(NO_3)_2$ are then introduced into the sheets solution. Said solution again gradually changes color while the fluorescence quantum yield strongly increases. The precursors are left reacting on the sheets for 24 hours. The sheets are then aggregated by addition of a few drops of ethanol and the solution is centrifuged 5 minutes at 5000 rpm. The supernatant containing the precursors that have not reacted as well as the CdZnS parasite nanocrystals is discarded and the pellet formed by the sheets is dispersed in 2 mL of chloroform to which 20 mg of a solution of $Cd(tetradecylphosphonate)_2$ $(Cd(TDPA)_2)$ 0.5 M in 1-octadecene are added. The fluorescence quantum yield then drops drastically. It increases afterwards under ultraviolet lighting. The sheets are then purified by precipitation with ethanol, centrifugation and suspension in hexane. This purification step can be carried out several times.

Alternatively, the CdSe/CdZnS sheets can be rendered dispersible in a polar medium. For this, the deposition step of $Cd(TDPA)_2$ is replaced by a deposition step of cadmium di-mercaptopropionate $(Cd(MPA)_2)$. Once the CdSe/CdZnS sheets are separated by centrifugation, they are dispersed in 2 mL of an aqueous solution of $Cd(MPA)_2$ at 0.1 M and pH 11. After 10 minutes of sonication, the mixture is centrifuged the supernatant discarded and 2 mL of distilled water are added on the precipitate. The sheets are then perfectly dispersible in aqueous solution.

Alternatively, in a vial are successively introduced 4 mL of chloroform, 1 mL of the CdSe sheets solution, 100 mg of thioacetamide (TAA) and 1 mL of octylamine. The solution is submitted to sonication for 5 minutes which causes the complete dissolution of TAA and a color change of the solution from yellow to orange. 350 μL of a 0.2 M solution of $Cd(NO_3)_2$ in ethanol and 150 μL of a 0.2 M solution of $Zn(NO_3)_2$ in ethanol are rapidly injected in the sheets' solution. It gradually changes colors while the quantum yield greatly increases. The precursors are left reacting for another 24 h at room temperature. The sheets are then aggregated by addition of a few drops of ethanol and the solution is centrifuged for 5 minutes at 4000 rpms. The supernatant containing the unreacted precursors as well as parasite CdZnS nanocrystals is discarded and the pellet containing the sheets is dispersed in 5 mL of chloroform. In order to increase the stability and the quantum yield of the sheets, 100 μL of a 0.2 M solution of $Zn(NO_3)_2$ in ethanol are added to the solution of platelets. They instantly aggregate and are dispersed by addition of 200 μL of oleic acid.

Example 2

Deposition of Flat Semiconductor Nanocrystals on a Planar Substrate, the Normal to the Sheets Parallel to the Normal to the Surface of the Planar Substrate We describe for example the deposition of flat semiconductor nanocrystals on a planar substrate, so as the normal to the flat semiconductor nanocrystals is parallel to the normal to the surface of the planar substrate according to a particular embodiment of the invention.

The sheets can deposit flatly on a surface when they are deposited by evaporation of a diluted solution containing them. It is possible to use several techniques taking advantage of this property.

A first possibility is to deposit the sheets by direct evaporation of a small amount of solvent containing the sheets. 1 mg of sheets is dispersed in 2 mL of a 9:1 in volume mixture of hexane and octane. One drop of the mixture is deposited on a glass slide. Due to the presence of octane, the drop spreads and dries evenly without forming ring with high concentration of sheets at the edges ("coffee ring effect"). Once the drop has dried, the deposited sheets are homogeneously distributed over the entire surface of the stain and they exhibit predominantly an orientation in which the normal of the nanocrystals is parallel to the normal to the surface.

A second possibility is to deposit the sheets by spin coating. At first, a microscope glass slide (26 mm by 26 mm) is cleaned with an oxygen plasma. It is then functionalized with 3-mercaptopropyl-triethoxysilane by immersion for 10 minutes in a 1% solution in volume of 3-mercaptopropyl-triethoxysilane in ethanol. The glass slide is rinsed three times with ethanol and dried. A 1 mg/mL solution of sheets in hexane is then deposited on the slide by spin coating at 1000 rpm for 30 seconds.

A third possibility is to deposit the sheets by dip coating. A glass slide previously washed with isopropanol is immersed in a 1 mg/mL solution of the sheets in hexane. The glass slide, oriented such as the normal to its surface is in the same plane as the air/solution interface, is slowly extracted from the solution at a constant speed of 1 cm by minute, so as to form an homogeneous film of sheets on the glass surface.

A fourth possibility is to deposit the sheets by depositing a Langmuir-Blodgett or Langmuir-Schaefer film of nanocrystals on the substrate. For this, a Langmuir film of nanocrystals is made by leaving a hexane solution of nanocrystals slowly evaporate on a surface of diethylene glycol (DEG) contained in a Teflon vessel. The resulting film can then be condensed with a Teflon bar dividing the surface of the tank into two parts. Once the film has reached the desired density, it is removed, either by applying directly the coating surface (deposition of Langmuir-Schaefer) or by slowly extracting the target surface from the DEG while maintaining the desired density for the film by decreasing its surface using the Teflon bar.

Example 3

Deposition of Sheets on a Microstructured Substrate

The microstructured substrate is a blazed grating. Neither direct evaporation nor spin coating can be applied here. The deposit by soaking allows on the contrary to obtain a homogeneous film of sheets on the surfaces of the blazed grating. The protocol described in the previous example is applied here, it is only necessary to ensure that the grating is extracted from the solution with the lines that compose it perpendicular to the liquid surface.

Example 4

Fabrication of a Light-Emitting Diode Using Semiconducting Polymers

We describe for example the fabrication of a light-emitting diode using semiconductor polymers according to a particular embodiment of the invention.

The light emitting diode is generally comprises a first electrode, a hole conducting polymer layer, a layer of semiconductor nanocrystals, a layer of electron conducting polymer and a second electrode such as shown schematically in FIG. 4. The electron or hole conducting layers are optional if the Fermi level of the electrode enables the direct injection of charges. It is also possible to insert an electron blocking layer or a hole blocking layer.

The glass substrate coated with an ITO transparent electrode (commercially available) is first washed with isopropanol and piranha mixture. On the clean substrate is then deposited by spin coating a layer of poly(3,4-ethylendioxythiophene):poly (styrenesulfonate) (PEDOT:PSS hole conducting layer) 30 nm thick. The assembly is then annealed at 250° C. for 20 minutes. The emissive layer consisting of CdSe/CdZnS sheets is then made by spin coating at 2500 rpm of a 10 mg/mL solution of nanocrystals in octane. Finally, the counter-electrode is made by thermal evaporation of 2 nm LiF (lithium fluoride) and 100 nm aluminum.

Example 5

Fabrication of a Light-Emitting Diode Using Semiconductor Oxides

We describe for example, the fabrication of a light-emitting diode using semiconductor oxides according to one embodiment of the invention.

The light-emitting diode comprises a first transparent ITO (indium tin oxide) electrode, a layer of nickel oxide, a layer of fluorescent colloidal nanocrystals, a zinc oxide layer and a silver electrode, as shown schematically in FIG. 4.

On a clean glass substrate, an ITO anode 60 nm thick is deposited by magnetron sputtering through a mask in an inert environment of argon at a pressure of 5 mTorr and a speed of 0.06 Å·s$^{-1}$. The substrate is heated at 250° C. during the deposition to increase the conductivity of the ITO. A 20 nm thick layer of p-doped NiO (hole conducting layer) is then deposited also by magnetron sputtering at a speed of 0.2 Å·s$^{-1}$ in a 2:100 oxygen in argon atmosphere and a pressure of 6 mTorr.

A dense layer of CdSe/CdZnS sheets is deposited on the NiO by spin coating of a solution of sheets dispersed in hexane under nitrogen. The concentration of the sheets solution is adjusted so as to obtain a deposit of about ten nanometers thick.

The electron conducting layer is then deposited on the sheets by simultaneous cathodic deposition of ZnO at 15 W and SnO$_2$ at 9 W under argon at a pressure of 5 mTorr. The deposition rate is 0.2 Å·s$^{-1}$.

Finally, the 40 mm thick silver electrode is deposited by thermal evaporation through a mask on the ZnO:SO$_2$ layer at a rate of 1.5 Å·s$^{-1}$.

Example 6

Fabrication of a Polymer Film Containing the Flat Semiconductor Nanocrystals-Wavelength Converter We describe for example, the fabrication of a polymer film containing the flat semiconductor nanocrystals-wavelength converter according to one embodiment of the invention.

The polymer used is a statistic polymer containing 95% methyl methacrylate and 5% acrylic acid. It is a commercially available poly(methyl methacrylate)-polyacrylic acid (PAA-PMMA).

In a three-necked flask are introduced the toluene solution of sheets, 10 mg of $Cd(Acetate)_2(H_2O)_2$ and 2 g of polymer (PMMA-PAA) previously dissolved in 10 mL of anisole. The mixture is heated at 100° C. for 2 hours with magnetic stirring. After cooling to room temperature, the mixture has a high quantum yield. The polymer/sheets composite is precipitated by adding 10 mL of hexane and then centrifuged. The supernatant is discarded and the precipitate dissolved in a few milliliters of anisole. The resulting composite can be shaped.

In one embodiment, the shaping of the composite is done by spin coating to form a thin film of polymer/sheets composite. In another embodiment, the composite is dried and is shaped by thermoforming.

Example 7

Fabrication of a Nanocrystals/Polymer Composite Film Through Layer-by-Layer Electrostatic Assembly In one embodiment of the invention, a rigid substrate (glass slide or PMMA slide for example) or a flexible substrate (polyethylene film of low density for example) previously cleaned is used as support. A polycationic polymer film, poly(diallyldimethylammonium chloride) (PDDA, Mw=5000-20000) is deposited on the support by dipping it into a 20 g/L solution containing PDDA at pH 9 (adjusted by addition of TBAOH:tetrabutylammonium hydroxide) for 20 minutes. After rinsing with ultrapure water (>18 MΩ cm) the support is immersed in a 100 mg/L aqueous solution of sheets stabilized with mercaptopropionic acid (negatively charged) for 20 minutes as well. The film formed is rinsed with ultrapure water.

In one embodiment of the invention, a multilayer film can be obtained by repeating the two adsorption steps of PDDA and the sheets.

Example 8

Fabrication of a Polymer Film Comprising Sheets as Well as Fluorescent Nanocrystals Excitation by Non-Radiative Energy Transfer The excitation by non-radiative transfer of energy is carried by FRET (Førster Resonance Energy Transfer) between an acceptor fluorophore, which is a core/shell CdSe/CdZnS water-soluble sheet prepared according to example 1 and donor fluorophores: ZnSe/ZnS colloidal semiconductor nanocrystals prepared by any known method.

In order to implement the excitation by FRET of the semiconductor sheets, the ZnSe/ZnS nanocrystals must be located as close as possible to the semiconductor layers. At first, one will prepare a dispersion of sheets on which are adsorbed the ZnSe/ZnS nanocrystals.

For this, the ZnSe/ZnS nanocrystals are first exchanged with a cationic water-soluble ligand according to any known method, the water-soluble cationic ligand may, in particular, be a dihydrolipoic acid functionalized with an amine or a quaternary ammonium.

10 mg of water-soluble CdSe/CdZnS sheets having a negative surface charge are dispersed in 10 mL of ultrapure water. To this solution is added dropwise 10 mL of a solution of 40 mg of previously synthesized ZnSe/ZnS nanocrystals bearing a positive surface charge dispersed in water. Sheets and nanocrystals assemble by electrostatic interactions. Sheets/nanocrystals complexes are purified by centrifugation and dispersed in 10 mL of ultrapure water. To this solution is added a 10 mL of a 10 mg/mL aqueous solution of PVA (polyvinyl alcohol). The solution is placed in a mold of appropriate size and the water is evaporated in an oven at 65° C. until complete drying of the composite film.

Example 9

Use of Flat Semiconductor Nanocrystals in the Fabrication of a Backlit Screen

In one embodiment of the invention, the semiconductor nanocrystals are deposited on a planar transparent substrate that can be flexible like plastic or rigid like glass. The substrate is placed between the backlit source emitting in the blue and the external transparent surface of the screen during its manufacture.

Example 10

Use of Flat Semiconductor Nanocrystals in the Fabrication of an Emissive Display In one embodiment of the invention, the flat semiconductor nanocrystals are deposited on a planar substrate to form a dense assembly that can be oriented. Flat semiconductor nanocrystals are transferred using a pad on a matrix designed to be able to excite the nanocrystals so that they emit light.

Example 11

Use of Electrophoretic Method to Deposit the Nanocrystal

The nanocrystals are initially dispersed in a non-polar solvent such as hexane. Two ITO (indium tin oxide) coated glass substrate are used and spaced by 1 cm. A high DC bias source is used to apply a 1 kV bias between the two ITO coated substrate. The deposition is conducted for 1 min to 1 h depending on the nanocrystal surface chemistry. Deposition only occurs on the positive electrodes. After the deposition the film is quickly rinsed on fresh acetone to clean the surface and get rid of the excess of ligand.

Bibliography

1. Amstutz et al. U.S. Pat. No. 4,634,229
2. Shi et al. U.S. Pat. No. 5,705,285
3. Suzuki et al. worldwide patent application no WO2010/028728
4. Jeong et al. Korean patent application no 1020100089606
5. Kazlas, P.; Linton, J. R. worldwide patent application no WO2009/011922
6. Rho et al. Korean patent application no 1020090036373
7. Sokolik, I.; Campos, R. A. worldwide patent application no 00/17903
8. Bawendi et al. U.S. Pat. No. 6,501,091
9. Kim, et al. *Nature Photonics* 2011, 5, 176-182.
10. Abécassis, et al. *Nano Lett* 2014, 14, 710.
11. Cassette et al. *ACS Nano,* 2012, 6, 6741.

The invention claimed is:

1. A component to emit light in response to activation of an excitation means, comprising:
   a support; and
   a plurality of anisotropic flat colloidal semiconductor nanocrystals, whose thickness dimension is smaller than the length and width of the anisotropic flat colloidal semiconductor nanocrystals by a factor of at least 1.5,
   wherein at least 50% of the plurality of nanocrystals have their normal to their largest surface substantially parallel to a given direction.

2. The component according to claim 1, wherein at least 50% of the plurality of anisotropic flat colloidal semiconductor nanocrystals have their normal to the largest surface substantially parallel or substantially perpendicular to the support.

3. The component according to claim 1, wherein the plurality of anisotropic flat colloidal semiconductor nanocrystals is a plurality of anisotropic flat colloidal semiconductor nanosheets.

4. The component according to claim 1, wherein the plurality of anisotropic flat colloidal semiconductor nanocrystals comprises at least one compound selected from the group consisting of group IV, group III-V, group II-VI, group III-VI, group I-III-VI, group II-V, group IV-VI, and a mixture thereof.

5. The component according to claim 1, wherein the plurality of anisotropic flat colloidal semiconductor nanocrystals comprises at least one compound selected from the group consisting of Si, Ge, CdS, CdSe, CdTe, ZnS, ZnSe, ZnTe, HgS, HgSe, HgTe, PbS, PbSe, PbTe, $CuInS_2$, $CuInSe_2$, $AgInS_2$, $AgInSe_2$, CuS, $Cu_2S$, $Ag_2S$, $Ag_2Se$, $Ag_2Te$, InN, InP, InAs, InSb, $In_2S_2$, $Cd_2P_2$, $Zn_2P_2$, $Cd_2As_2$, $Zn_2As_2$, ZnO, AlN, AlP, AlAs, AlSb, GaN, GaP, GaAs, GaSb FeSv, TiOv, $Bi_2S_2$, $Bi_2Se_2$, and $Bi_2Te_2$.

6. The component according to claim 1, wherein the plurality of anisotropic flat colloidal semiconductor nanocrystals comprises at least one heterostructure comprising an anisotropic flat colloidal semiconductor nanocrystal.

7. The component according to claim 1, wherein the plurality of anisotropic flat colloidal semiconductor nanocrystals comprises at least one anisotropic flat colloidal semiconductor nanocrystal totally covered with a semiconductor of different chemical composition.

8. The component according to claim 1, wherein the plurality of anisotropic flat colloidal semiconductor nanocrystals exhibits a narrow fluorescence spectrum, with a full width at half maximum of less than 100 nm, 75 nm, 50 nm, 40 nm, 30 nm, 25 nm, 24 nm, 23 nm, 22 nm, 21 nm or 20 nm.

9. The component according to claim 1, wherein the support is transparent for the emitted light in at least one direction towards an observer located outside the component, the support surface through which the light is emitted towards the observer being defined as an emitting face.

10. The component according to claim 1, wherein the support comprises a liquid having liquid crystals properties.

11. The component according to claim 1, wherein the support is flexible or rigid.

12. The component according to claim 1, wherein the support comprises an inorganic material or an organic material.

13. The component according to claim 1, wherein the support comprises a polymer material.

14. The component according to claim 1, wherein the plurality of anisotropic flat colloidal semiconductor nanocrystals comprises at least two anisotropic flat colloidal semiconductor nanocrystals having different characteristics, dimensions, chemical compositions and/or emission wavelengths.

15. The component according to claim 1, wherein the emitted light has an intensity and a polarization which vary according to the angle formed by the light emitting direction and the normal to the largest surface of the plurality of anisotropic flat colloidal semiconductor nanocrystals.

16. A light emitting system comprising:
   the component according to claim 1; and
   at least one excitation means comprising means for applying to the plurality of anisotropic flat colloidal semiconductor nanocrystals an electromagnetic field,
   wherein at least a portion of the emitted light is absorbed by the plurality of anisotropic flat colloidal semiconductor nanocrystals.

17. An apparatus comprising at least one light emitting system according to claim 16.

18. The light emitting system according to claim 16, wherein the at least one excitation means comprising means for applying to the plurality of anisotropic flat colloidal semiconductor nanocrystals an electromagnetic field is a light source.

19. The light emitting system according to claim 18, wherein the light source is a gallium nitride diode.

* * * * *